United States Patent
Bickford

(10) Patent No.: US 11,525,870 B2
(45) Date of Patent: Dec. 13, 2022

(54) ELECTROMAGNETIC GRADIOMETERS

(71) Applicant: THE CHARLES STARK DRAPER LABORATORY, INC., Cambridge, MA (US)

(72) Inventor: James A. Bickford, Winchester, MA (US)

(73) Assignee: The Charles Stark Draper Laboratory, Inc., Cambridge, MA (US)

(*) Notice: Subject to any disclaimer, the term of this patent is extended or adjusted under 35 U.S.C. 154(b) by 561 days.

(21) Appl. No.: 16/150,460

(22) Filed: Oct. 3, 2018

(65) Prior Publication Data

US 2020/0025840 A1   Jan. 23, 2020

Related U.S. Application Data

(60) Provisional application No. 62/568,627, filed on Oct. 5, 2017.

(51) Int. Cl.
*G01R 33/022* (2006.01)
*G01R 33/038* (2006.01)
(Continued)

(52) U.S. Cl.
CPC ....... *G01R 33/022* (2013.01); *G01R 33/0041* (2013.01); *G01R 33/0082* (2013.01); *G01R 33/0286* (2013.01); *G01R 33/038* (2013.01)

(58) Field of Classification Search
CPC ............ G01R 33/0094; G01R 33/0082; G01R 33/0041; G01R 33/022; G01R 33/038;
(Continued)

(56) References Cited

U.S. PATENT DOCUMENTS 4,380,735 A   4/1983 Bell
4,439,732 A * 3/1984 Hesterman ........... G01R 33/022
                                                    324/247
(Continued)

FOREIGN PATENT DOCUMENTS

CN   102879655 A   1/2013
CN   103390478 A   11/2013
(Continued)

OTHER PUBLICATIONS

Williams et al., "Vacuum Steered-Electron Electric-Field Sensor", Journal of Microelectromechanical Systems, pp. 1-10, Jan. 15, 2013.
(Continued)

*Primary Examiner* — David M Schindler
(74) *Attorney, Agent, or Firm* — Brooks Kushman, P.C.

(57) ABSTRACT

An electromagnetic gradiometer that includes multiple torsionally operated MEMS-based magnetic and/or electric field sensors with control electronics configured to provide magnetic and/or electric field gradient measurements. In one example a magnetic gradiometer includes a first torsionally operated MEMS magnetic sensor having a capacitive read-out configured to provide a first measurement of a received magnetic field, a second torsionally operated MEMS magnetic sensor coupled to the first torsionally operated MEMS magnetic sensor and having the capacitive read-out configured to provide a second measurement of the received magnetic field, and control electronics coupled to the first and second torsionally operated MEMS magnetic sensors and configured to determine a magnetic field gradient of the received magnetic field based the first and second measurements from the first and second torsionally operated MEMS electromagnetic sensors.

16 Claims, 11 Drawing Sheets

(51) Int. Cl.
*G01R 33/00* (2006.01)
*G01R 33/028* (2006.01)

(58) Field of Classification Search
CPC .............. G01R 33/0286; G01R 33/028; G01R 33/0283; G01R 15/00; G01R 15/14
See application file for complete search history.

(56) References Cited

U.S. PATENT DOCUMENTS

| | | | |
|---|---|---|---|
| 4,600,883 A * | 7/1986 | Egli | G01R 29/0892 |
| | | | 318/647 |
| 4,670,092 A | 6/1987 | Motamedi | |
| 5,224,380 A | 7/1993 | Paik | |
| 5,908,986 A | 6/1999 | Mitamura | |
| 5,945,898 A | 8/1999 | Judy et al. | |
| 5,987,986 A | 11/1999 | Wyse et al. | |
| 6,028,773 A | 2/2000 | Hundt | |
| 6,250,156 B1 | 6/2001 | Seshia et al. | |
| 6,429,652 B1 | 8/2002 | Allen et al. | |
| 6,487,864 B1 | 12/2002 | Platt et al. | |
| 6,670,809 B1 | 12/2003 | Edelstein et al. | |
| 6,874,363 B1 | 4/2005 | Foote et al. | |
| 7,185,541 B1 | 3/2007 | Edelstein | |
| 7,231,094 B2 | 6/2007 | Bickford et al. | |
| 7,394,245 B2 | 7/2008 | Brunson et al. | |
| 7,642,692 B1 | 1/2010 | Pulskamp | |
| 7,773,228 B1 | 8/2010 | Hollingsworth et al. | |
| 7,972,888 B1 | 7/2011 | Li et al. | |
| 8,205,497 B1 | 6/2012 | Okandan et al. | |
| 8,674,689 B1 | 3/2014 | Nielson et al. | |
| 8,701,490 B2 | 4/2014 | Jiang et al. | |
| 9,182,454 B1 | 11/2015 | Williams et al. | |
| 10,531,805 B2 | 1/2020 | Bickford et al. | |
| 10,564,200 B2 | 2/2020 | Bickford et al. | |
| 10,585,150 B2 | 3/2020 | Bickford et al. | |
| 2002/0162947 A1 | 11/2002 | Weitekamp et al. | |
| 2003/0140699 A1 | 7/2003 | Pike et al. | |
| 2003/0200807 A1 | 10/2003 | Hulsing | |
| 2004/0187578 A1 | 9/2004 | Malametz et al. | |
| 2005/0234329 A1 | 10/2005 | Kraus et al. | |
| 2006/0032306 A1 | 2/2006 | Robert | |
| 2006/0283246 A1 | 12/2006 | Weinberg et al. | |
| 2007/0029629 A1 | 2/2007 | Yazdi | |
| 2007/0096729 A1 | 5/2007 | Brunson et al. | |
| 2010/0005884 A1* | 1/2010 | Weinberg | G01C 19/5719 |
| | | | 73/504.15 |
| 2010/0099942 A1 | 4/2010 | Portelli | |
| 2010/0108478 A1 | 5/2010 | Zhe et al. | |
| 2010/0295138 A1 | 11/2010 | Montanya Silvestre et al. | |
| 2011/0048133 A1 | 3/2011 | Lin et al. | |
| 2011/0054345 A1 | 3/2011 | Nagatani | |
| 2011/0056294 A1 | 3/2011 | Simoni et al. | |
| 2011/0062820 A1 | 3/2011 | Aoyagi et al. | |
| 2012/0272711 A1 | 11/2012 | Supino et al. | |
| 2012/0326700 A1 | 12/2012 | Swanson et al. | |
| 2013/0324832 A1 | 12/2013 | Wu et al. | |
| 2014/0023999 A1 | 1/2014 | Greder | |
| 2014/0125325 A1 | 5/2014 | Ocak et al. | |
| 2014/0182377 A1 | 7/2014 | Lin et al. | |
| 2014/0308757 A1 | 10/2014 | Ju | |
| 2014/0316188 A1 | 10/2014 | Peterchev et al. | |
| 2014/0358016 A1 | 12/2014 | Shapira et al. | |
| 2014/0375338 A2* | 12/2014 | Chi | G01R 29/12 |
| | | | 324/658 |
| 2015/0226762 A1 | 8/2015 | Seshia et al. | |
| 2016/0023002 A1 | 1/2016 | Schulhauser et al. | |
| 2016/0081577 A1 | 3/2016 | Sridhar et al. | |
| 2016/0116499 A1 | 4/2016 | Thompson | |
| 2016/0120432 A1 | 5/2016 | Sridhar et al. | |
| 2016/0341762 A1 | 11/2016 | Waters et al. | |
| 2016/0349283 A1 | 12/2016 | Bramhavar et al. | |
| 2017/0097382 A1* | 4/2017 | Bickford | G01R 29/0878 |
| 2017/0097394 A1* | 4/2017 | Bickford | G01R 33/038 |
| 2017/0276697 A1 | 9/2017 | Campsie et al. | |
| 2017/0281086 A1 | 10/2017 | Donaldson | |
| 2018/0284175 A1 | 10/2018 | Bickford et al. | |
| 2018/0292470 A1 | 10/2018 | Bickford et al. | |

FOREIGN PATENT DOCUMENTS

| | | | |
|---|---|---|---|
| CN | 103342562 B | | 2/2015 |
| CN | 104459351 A | | 3/2015 |
| CN | 205620559 U | * | 10/2016 |
| CN | 106093605 A | | 11/2016 |
| DE | 102014204721 A1 | | 9/2015 |
| EP | 0702981 A1 | | 3/1996 |
| EP | 2199741 A2 | | 6/2010 |
| EP | 2466257 A1 | | 6/2012 |
| JP | 2011136158 A | | 7/2011 |
| WO | 02084315 A1 | | 10/2002 |
| WO | 2012071545 A1 | | 5/2012 |
| WO | 2014025353 A1 | | 2/2014 |
| WO | 2014205356 A2 | | 12/2014 |

OTHER PUBLICATIONS

Ando et al., "E-Field Ferroelectric Sensor Modeling and Simulation", IEEE Instrumentation & Measurement Magazine, pp. 31-37, 2009.
Bai et al., "A novel easy-driving and easy-signal-processing electrostatic field sensor based on piezoresistance and PET lever", Author Submitted Manuscript, pp. 1-15.
Bogue, R., "Plessey launches range of unique electric field sensors", Sensor Review, vol. 32, No. 3, pp. 194-198, 2012.
Chen et al., "Micromachined ac/dc electric field sensor with modulated sensitivity", Sensors and Actuators, No. 245, pp. 76-84, Apr. 26, 2016.
Huang et al., "A novel high-sensitivity electrostatic biased electric field sensor", Journal of Micromechanics and Microengineering, vol. 25, pp. 1-9, Aug. 17, 2015.
Miles et al., "Report on Non-Contact DC Electric Field Sensors", Jun. 23, 2009.
Datskos et al., "Using Micro-Electro-Mechanical Systems (MEMS) as Small Antennas", IEEE, 2012.
Toney et al., "Detection of Energized Structures with an Electro-Optic Electric Field Sensor", IEEE, pp. 1364-1369, May 2014.
Petrov et al., "Electric Field Encephalography as a Tool for Functional Brain Research: A Modeling Study", PLOS ONE, vol. 8, No. 7, Jul. 3, 2013.
Angelakis et al., "EEG Neurofeedback: A Brief Overview and an Example of Peak Alpha Frequency Training for Cognitive Enhancement in the Elderly", The Clinical Neuropsychologist, vol. 21, pp. 110-129, Feb. 16, 2007.
Ashrafulla, S., "EEG and MEG: functional brain imaging with high temporal resolution", Jun. 2013, <URL: https://ngp.usc.edu/files/2013/06/Syed_EEG MEG.pdf>.
Basar et al., "A review of brain oscillations in cognitive disorders and the role of neurotransmitters", Brain Research, vol. 1235, pp. 172-193, Jul. 2, 2008.
Choi, K., "Electroencephalography (EEG) based neurofeedback training for brain-computer interface (BCI)", pp. 1-26, Sep. 2013.
Gabrielson, T.B., "Mechanical-Thermal Noise in Micromachined Acoustic and Vibration Sensors", IEEE Transactions On Electron Devices, vol. 40, No. 5, pp. 903-909, May 1993.
Grummett et al., "Measurement of neural signals from inexpensive, wireless and dry EEG systems", Physiological Measurement, vol. 36, pp. 1469-1484, 2015.
Heintzelman et al., "Characterization and Analysis of Electric-field Sensors", IEEE, Dec. 17, 2015.
Kingsley et al., "Photrodes for physiological sensing", SPIE 5317, Optical Fibers and Sensors for Medical Applications IV, Jun. 2004.
Niv, S., "Clinical efficacy and potential mechanisms of neurofeedback", Personality and Individual Differences, vol. 54, pp. 676-686, Jan. 24, 2013.
Othmer, S., "Neuromodulation technologies: An attempt at classification", Introduction to Quantitative EEG and Neurofeedback: Advanced Theory and Applications, second edition, pp. 1-27, 2009.

(56) References Cited

OTHER PUBLICATIONS

Prance, H., "Sensor Developments for Electrophysiological Monitoring in Healthcare", Applied Biomedical Engineering, pp. 265-286, Aug. 2011.
Schalk et al., "Brain Sensors and Signals", A Practical Guide to Brain-Computer Interfacing with General-Purpose Software for Brain-Computer Interface Research, Data Acquisition, Stimulus Presentation, and Brain Monitoring, pp. 9-35, 2010.
Stikic et al., "Modeling temporal sequences of cognitive state changes based on a combination of EEG-engagement, EEG-workload, and heart rate metrics", Frontiers in Neuroscience, vol. 8, article 342, pp. 1-14, Nov. 2014.
Budzynski et al., "Introduction to Quantitative EEG and Neurofeedback: Advanced Theory and Applications," 2nd ed., Elsevier (2009), chapters 1, 6, 8 and 16.
Denison et al., "A Self-Resonant MEMS-Based Electrometer", IEEE Instrumentation and Measurement Technology Conference Proceedings, May 2007, pp. 1-5.
Bickford, J. "Monitoring Brain Activity (E-Field Sensor)", Draper, accessed Oct. 31, 2016.
Kelly et al., "Progress Toward Forecasting of Space Weather Effects on UHF Satcom after Operation Anaconda", Space Weather, Sep. 12, 2014, doi: 10.1002/2014SW001081.
Bernstein et al., "Low-Noise MEMS Vibration Sensor for Geophysical Applications," Journal of Microelectromechanical Systems, val 8, No. 4, pp. 433-438, 2009.
Dilella et al., "A Micromachined Magnetic-Field Sensor Based on an Electron Tunneling Displacement Transducer," Sensors and Actuators vol. 86, pp. 8-20, 2000.

Dong et al., "Push-Pull Mode Magnetostrictive/Piezoelectric Laminate Composite with an Enhanced Magnetoelectric Voltage Coefficient," Applied Physics Letters, vol. 87, pp. 62502. 2005.
Kyynarainen et al., "A 3D Micromechanical Compass," Sensors and Actuators A, vol. 142, pp. 561-568. 2008.
Latorre et al., "Micromachined CMOS Magnetic Field Sensor with Ferromagnetic Actuation," Proceedings of SPIE, vol. 4019, 2000.
Tatarchuk et al., "A MEMS DC Current Sensor Utilizing Neodymium Rare Earth Magnets," Additional Conferences (Device Packaging, HiTEC, HiTEN, & CICMT): Jan. 2014, vol. 2014, No. DPC, pp. 001046-001071.
Vasquez et al., "Optically-Interrogated Zero-Power MEMS Magnetometer", Journal of Microelectromechanical Systems, vol. 16, No. 2, pp. 336-343, Apr. 2007.
Wickenden et al., "Polysilicon Xylophone Bar Magnetometers," SPIE vol. 3876, pp. 267-273. Sep. 1999.
Yang et al., "Ferromagnetic Micromechanical Magnetometer," Sensors and Actuators A, vol. 97-98, pp. 88-97, 2002.
Zhao et al., "Fabrication and Characterization of All-Thin-Film Magnetoelectric Sensors," Applied Physics Letters, vol. 94, p. 243507. 2009.
Chen et al. "MEM Electric Field Sensor using Force Deflection with Capacitance Interrogation", Power & Energy Society General Meeting. IEEE (2013).
Kuriyama et al. "Electrostatic Field Distribution Measurement Using Silicon Micro-mirror Array", IEEE International Symposium on Electromagnetic Compatibility (2012), pp. 351-356.
Goel, M. "Electret sensors, filters and MEMS devices: New challenges in materials research", Current Science (2003) vol. 85, No. 4, pp. 443-453.

\* cited by examiner

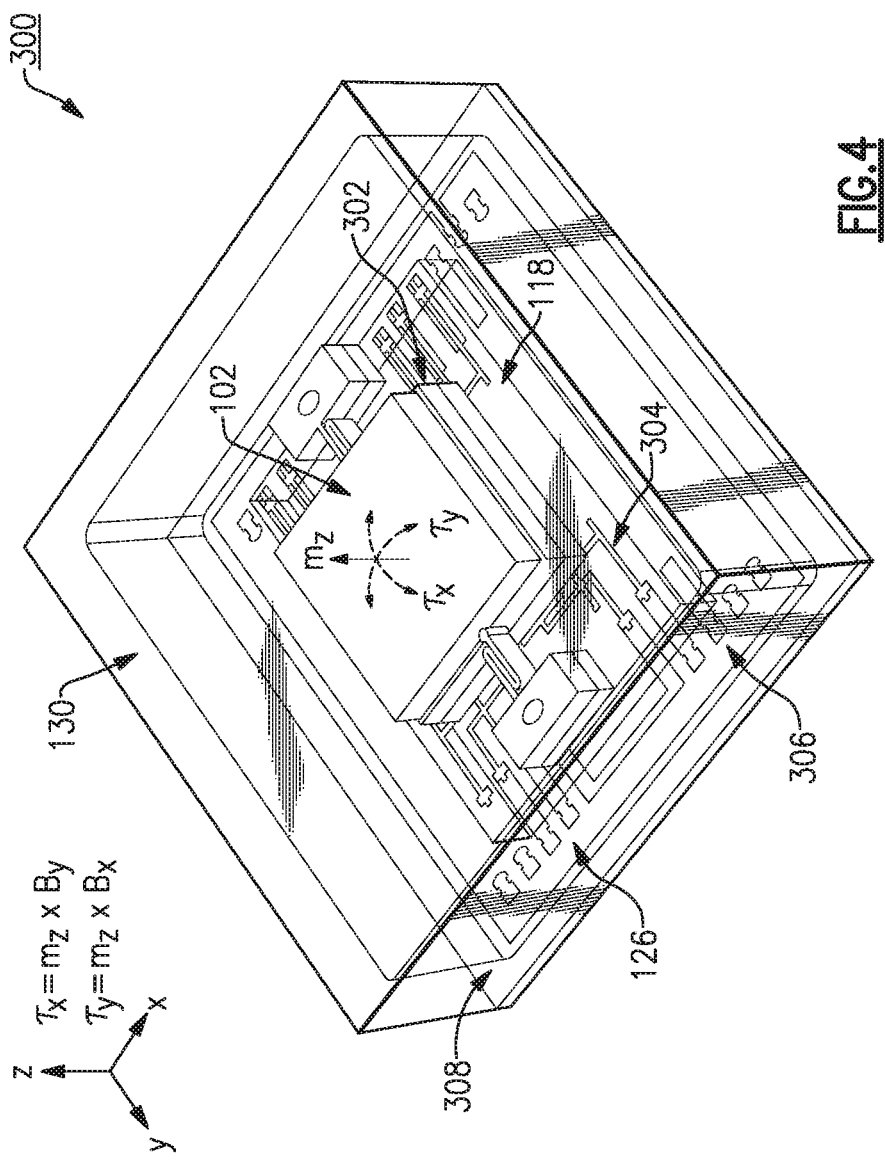

ELECTROMAGNETIC GRADIOMETERS

CROSS-REFERENCE TO RELATED APPLICATIONS

This application claims the benefit under 35 U.S.C. § 119(e) of co-pending U.S. Provisional Application No. 62/568,627 titled "MAGNETIC GRADIOMETERS AND METHODS" and filed on Oct. 5, 2017, which is herein incorporated by reference in its entirety for all purposes.

BACKGROUND

Precision magnetometers have existed for nearly a century. During the Second World War, flux-gate magnetometers were applied to detect submerged submarines based on the ferromagnetic properties of their hulls. Since the first use of magnetometers, technology has continued to advance to enable near-field, quasi-static, magnetometry in the extremely low frequency (ELF) band. Applications of this technology include proximity detection (e.g., ships, submarines, mines, etc.), energy resource prospecting, non-destructive testing of structures (e.g., civil infrastructure, welding joints, etc.), various biomedical applications (e.g., magneto-encephalography), communication through conductive media, and precision current sensing among other applications.

However, several important factors have made extending the magnetometer technology challenging. One of the most recognizable issues is the presence of significant background interferers. Background interferers quickly mask tiny signal emissions as the range between the source and the detector is increased. Background interference, often called "clutter", may be of both natural (e.g., solar activity, such as, lightning) and anthropogenic (e.g., power lines, machinery, etc.) origin. Heavy magnetic shielding can reduce these clutter noise sources for some applications (e.g., biomedical applications). However, magnetic shielding is typically extremely expensive, and challenging to extend to free-field detection scenarios, such as searching for submarines.

Moreover, at very low frequencies, vibrations of the magnetometer sensors may produce interference signals as a result of the larger static magnetic field of the Earth. Linear motion through the Earth's gradient is a factor, but for vector magnetometers, the greatest challenge is the rotational vibration (e.g., jitter), which may cause the very large background field of the Earth to be modulated into the sense bandwidth of the magnetometer. This is especially problematic on moving platforms. A scalar magnetometer may avoid the first order error by reducing the total number of degrees of freedom measured; however, scalar magnetometers are limited in the information that they can provide.

The noise floor of modern magnetometers has been reduced to a level where the above-discussed factors dominate the performance of any deployed system. For instance, near 1 Hz, the clutter background is often orders of magnitude (40-60 dB) larger than existing precision instruments. Likewise, the resulting jitter induced noise can be much worse and require high precision (<1 nrad/√Hz) instruments for compensation. These instruments are often expensive and may not be available for some applications.

SUMMARY OF THE INVENTION

Aspects and embodiments are directed to micro-electro-mechanical systems (MEMS) based sensor systems, including MEMS-based torsional gradiometers, gradiometer systems, and related methods. In certain example, multiple low-noise MEMS electromagnetic sensors are coupled together to form an electromagnetic gradiometer. The integrated MEMS electromagnetic sensors may be used to measure some or all components of a magnetic and/or electric field gradient matrix and vector field.

According to one embodiment, a magnetic gradiometer comprises a first torsionally operated MEMS magnetic sensor having a capacitive read-out configured to provide a first measurement of a received magnetic field, a second torsionally operated MEMS magnetic sensor coupled to the first torsionally operated MEMS magnetic sensor and having the capacitive read-out configured to provide a second measurement of the received magnetic field, and control electronics coupled to the first and second torsionally operated MEMS magnetic sensors and configured to determine a magnetic field gradient of the received magnetic field based the first and second measurements from the first and second torsionally operated MEMS electromagnetic sensors.

In one example each of the first and second torsionally operated MEMS magnetic sensors includes a proof-mass, a magnetic dipole source coupled to the proof mass, and a substrate having a substrate offset space defined therein, wherein the proof-mass is suspended above the substrate offset space, and a first sense electrode disposed on the substrate within the substrate offset space and positioned proximate the proof-mass, the first sense electrode being configured to measure a change in capacitance relative to the proof mass from torsional movement of the proof-mass in response to the received magnetic field at the magnetic dipole source. In one example each of the first and second torsionally operated MEMS magnetic sensors further includes a counterbalance coupled to the proof-mass, wherein the magnetic dipole source is coupled to a first surface of the proof-mass and the counterbalance is coupled to a second surface of the proof-mass distal the magnetic dipole source. In another example each of the first and second torsionally operated MEMS magnetic sensors further includes a second sense electrode disposed on the substrate, and wherein the first sense electrode and the second sense electrode are configured to provide a differential capacitance measurement based on the change in capacitance from the torsional movement of the proof-mass. Each of the first and second torsionally operated MEMS magnetic sensors may further include at least one drive electrode positioned proximate the proof-mass and configured to produce a feedback torque on the proof-mass. In one example the magnetic dipole source is a permanent magnet. In one example the permanent magnet is a Neodymium Iron Boron (NdFeB) rare Earth permanent magnet. In another example each of the first and second torsionally operated MEMS magnetic sensors further includes at least one support coupled to the proof-mass and configured to suspend the proof-mass above the substrate offset space. The magnetic field gradiometer may further comprise an electronic feedback loop configured to stabilize a scale factor of the magnetic field gradiometer by monitoring and adjusting a resonant frequency of the at least one support.

In one example the magnetic gradiometer further comprises a circuit board that electrically couples the first torsionally operated MEMS magnetic sensor to the second torsionally operated MEMS magnetic sensor, wherein the control electronics is formed on the circuit board. The magnetic gradiometer may further comprise a reference structure that magnetically couples the first torsionally operated MEMS magnetic sensor to the second torsionally operated MEMS magnetic sensor. In one example the magnetic gradiometer further comprises at least one reference magnet that produces a reference magnetic field configured to mutually align the first and second torsionally operated MEMS magnetic sensors to a common vector such that their magnetic moments are aligned. In another example the magnetic gradiometer further comprises a high permeability shunt that couples together the first and second torsionally operated MEMS magnetic sensors and the at least one reference magnet. In one example the high permeability shunt includes a soft ferrite cage configured to provide shielding for the control electronics.

According to another embodiment an electric field gradiometer comprises a first torsionally operated MEMS electric field sensor having a capacitive read-out configured to provide a first measurement of a received electric field, a second torsionally operated MEMS electric field sensor coupled to the first torsionally operated MEMS electric field sensor and having the capacitive read-out configured to provide a second measurement of the received electric field, and control electronics coupled to the first and second torsionally operated MEMS electric field sensors and configured to determine an electric field gradient of the received electric field based the first and second measurements from the first and second torsionally operated MEMS electric field sensors.

In one example the electric field gradiometer further comprises at least one electric field generator that produces a reference field configured to mutually align the first and second torsionally operated MEMS electric field sensors to a common vector such that their electric dipole moments are aligned.

According to another embodiment an integrated electromagnetic gradiometer array comprises at least two magnetic gradiometers, each magnetic gradiometer including a first torsionally operated MEMS magnetic sensor having a magnetic field capacitive read-out configured to provide a first measurement of a received magnetic field, a second torsionally operated MEMS magnetic sensor coupled to the first torsionally operated MEMS magnetic sensor and having the magnetic field capacitive read-out configured to provide a second measurement of the received magnetic field, and magnetic sensor control electronics coupled to the first and second torsionally operated MEMS magnetic sensors and configured to determine a magnetic field gradient of the received magnetic field based the first and second measurements from the first and second torsionally operated MEMS electromagnetic sensors.

In one example the integrated electromagnetic gradiometer array further comprises at least one electric field gradiometer, the at least one electric field gradiometer including a first torsionally operated MEMS electric field sensor having an electric field capacitive read-out configured to provide a first measurement of a received electric field, a second torsionally operated MEMS electric field sensor coupled to the first torsionally operated MEMS electric field sensor and having the electric field capacitive read-out configured to provide a second measurement of the received electric field, and electric field sensor control electronics coupled to the first and second torsionally operated MEMS electric field sensors and configured to determine an electric field gradient of the received electric field based the first and second measurements from the first and second torsionally operated MEMS electric field sensors.

In another example the integrated electromagnetic gradiometer array further comprises at least one torsionally operated MEMS electric field sensor having an electric field capacitive read-out configured to provide measurements of a received electric field. In another example the integrated electromagnetic gradiometer array further comprises at least one additional torsionally operated MEMS magnetic sensor having the magnetic field capacitive read-out configured to provide a corresponding at least one additional measurement of the received magnetic field.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 4 is a diagram showing a perspective view of one example of a torsionally operated magnetic sensor having a capacitive read-out according to aspects of the present invention;

DETAILED DESCRIPTION

Figure 1:
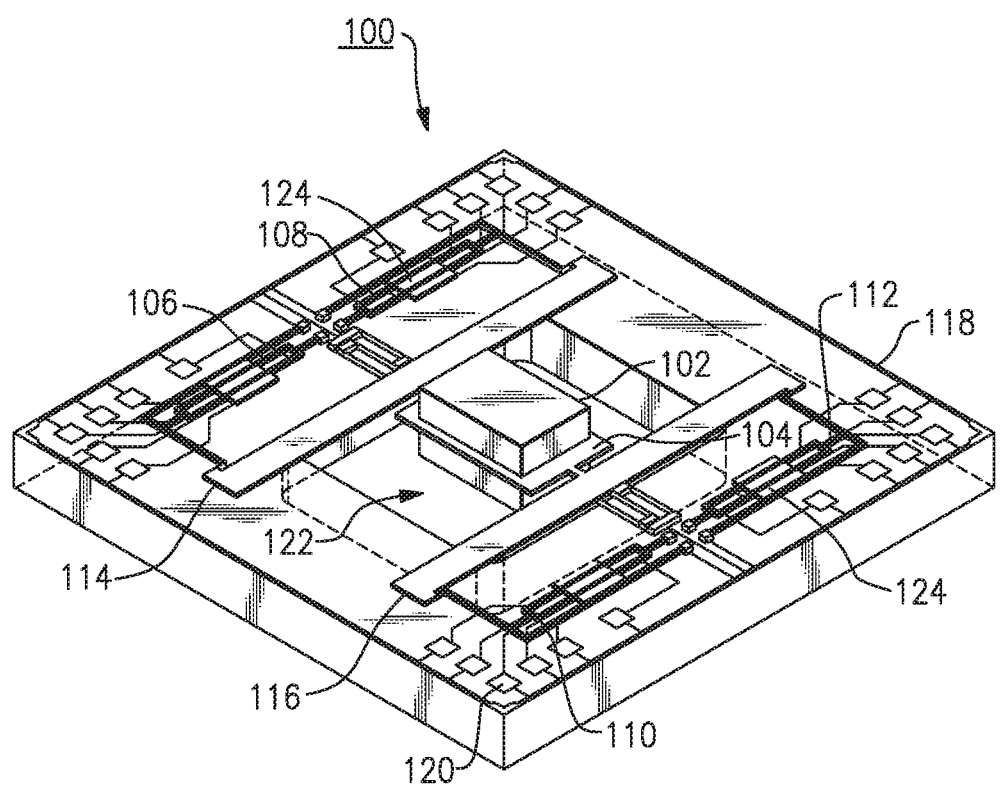
FIG. 1 is a diagram of one example of a magnetic sensor incorporating a frequency-based torque measurement mechanism according to aspects of the present invention.

Although magnetics technology may be viewed as mature, advancing applications continue to drive the need to develop and improve precision magnetometers. For example, the advent of low cost unmanned aerial vehicles, has provided an avenue to improve the cost effectiveness of large-scale magnetic surveys. This in turn drives a need to achieve very high levels of performance (low noise) while operating in the Earth field with low size, weight and power (SWaP).

The various challenges associated with magnetometers discussed above have prevented the widespread adoption of advanced magnetometer systems that operate in the open ambient field of the Earth. One approach to addressing the discussed challenges includes measuring a magnetic field gradient instead of the field itself. The gradient of clutter, which tends to come from distant sources, is remarkably different than the signal source, which tends to be at a much closer range to the sensor. Therefore, the gradient provides an orthogonal measurement that allows the signal and clutter to be separated from one another. A rigid gradiometer also has the advantage that the first order vibration errors are also eliminated from the measurements. A gradiometer therefore offers a mechanism to eliminate the most problematic system issues of traditional Earth-field magnetometers. Nonetheless traditional gradiometers are not without their own drawbacks. In particular, measurements of magnetic field gradient fall off as $1/r^4$ with range (r) from the source dipole of the signal. Accordingly, detection becomes difficult for many important applications, such as submarine detection.

Aspects and embodiments of the devices and methods disclosed herein address the drawbacks associated with typical magnetometers and gradiometers, while also improving performance such that signals may be measured at great ranges in the ambient Earth field. In particular, certain aspects and embodiments are directed to MEMS based torsional magnetometers which are able to address the modern needs of integration on small mobile platforms. As discussed in more detail below, MEMS-based sensors can be configured to measure differential torques generated by magnetized structures exposed to a magnetic field. MEMS-based magnetic gradiometers according to certain examples may include transducers that are coupled magnetically and electrically, with an ability to tune to near zero stiffness, or operate in a resonant mode, for maximum sensitivity and bias stability. Examples of the MEMS-based magnetic gradiometers disclosed herein may simultaneously achieve low-noise (e.g., less than 100 fT/√Hz), high dynamic range (e.g., greater than 50 μT) operation in a small volume (e.g., less than 100 cm³) to enable production of a high performance airborne magnetometry system having SWaP compatible with low-cost platforms, such as small unmanned aircraft. Moreover, examples of the magnetic gradiometers disclosed herein may eliminate the need for costly shielding and/or Earth-field compensation associated with conventional ground-based systems. In addition, certain aspects and embodiments are directed to MEMS-based electric field sensors that use similar torsional sensor technology. Such sensors may open up new opportunities in biophysical sensing, for example. In particular, non-contact measurement of electric fields from the brain offers a mechanism to make widespread cognitive feedback practical, and benefit numerous applications, including cognitive enhancement and optimized training, brain computer interfaces, diagnosis and treatment and treatment of neurological conditions, and mal-intent detection. In addition, the MEMS-based electric field sensors may be used to take other types of biophysical measurements, such as heart rate measurements, for example.

It is to be appreciated that embodiments of the methods, systems, and apparatuses discussed herein are not limited in application to the details of construction and the arrangement of components set forth in the following description or illustrated in the accompanying drawings. The methods, systems, and apparatuses are capable of implementation in other embodiments and of being practiced or of being carried out in various ways. Examples of specific implementations are provided herein for illustrative purposes only and are not intended to be limiting. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

As discussed above, certain embodiments are directed to a magnetic gradiometer. In various examples, the magnetic gradiometer includes one or more MEMS-based magnetic sensors. FIG. 1 is a diagram of one example of a MEMS-based torsionally operated magnetic sensor 100 according to certain embodiments. In the illustrated example, the MEMS-based magnetic sensor 100 includes a proof-mass 102 that includes a magnetic dipole source. The magnetic dipole source may be a hard magnet (e.g., a Neodymium Iron Boron (NdFeB) rare Earth permanent magnet). The proof-mass 102 is placed on (or otherwise attached to) a Silicon structure 104. The Silicon structure 104 is attached to a plurality of supports 106, 108, 110, 112. In various examples, the plurality of supports 106, 108, 110, 112 act like springs, and movement of the proof-mass 102 is constrained by the spring force of each support, damping forces, and inertial forces. The magnetic sensor 100 further includes a plurality of geometric isolation structures 114, 116 which may isolate the plurality of supports 106, 108, 110, 112 from a differential thermal strain between the proof-mass 102 and the plurality of supports 106, 108, 110, 112. FIG. 1 shows an example of an "H-shaped" arrangement which may reduce the sensitivity of the sensor 100 to errors by substantially isolating the plurality of supports 106, 108, 110, 112 from thermal deformations. In the example of FIG. 1, a first geometric isolation structure 114 is interposed between a first support 106 and the proof-mass 102, and a second support 108 and the proof-mass 102. Similarly, a second geometric isolation structure 116 is interposed between a third support 110 and the proof-mass 102, and a fourth support 112 and the proof-mass 102. Each isolation structure 114, 116 may suspend the proof-mass 102 relative to a mounting surface, such as a shared substrate 118 (e.g., silicon or glass substrate). The shared substrate 118 may support additional components of the sensor 100, and may provide routing for electrical contacts 120. Electrical contacts 120 may be used to electrically couple various components of the sensor 100 to external circuitry or devices.

In the example shown in FIG. 1, the first geometric isolation structure 114 and the second geometric isolation structure 116 suspend the proof-mass 102 in an opening 122 defined by the shared substrate 118. The opening 122 in the substrate 118 may allow access to a backside of the proof-mass 102, which may make attaching the magnetic dipole source easier. As illustrated, each geometric isolation structure 114, 116 includes a first arm (e.g., fork-shaped arm) coupled to the proof-mass 102 and a second arm (e.g., serpentine-shaped arm) coupled to the respective supports. As shown, each of the geometric isolation structures 114, 116 extend in a direction across the opening that is substantially parallel to a direction of extension of the respective supports. Accordingly, the geometric isolation structures 114, 116 position each support 106, 108, 110, 112 in an orientation that is substantially orthogonal to a direction of thermal expansion of the proof-mass 102. Accordingly, the geometric isolation structures 114, 116 geometrically reduce the thermal sensitivity of each of the supports 106, 108, 110, 112. In the example shown in FIG. 1, each of the support beams 106, 108, 110, 112 is split into a fork to further reduce damping losses.

The hard magnet generates a magnetic dipole which produces a torque on the proof-mass 102 when exposed to a magnetic field. The torque imparted on the proof-mass 102 generates an axial force on the plurality of supports 106, 108, 110, 112. The torque may be determined directly, or indirectly, to determine one or more characteristic of the magnetic field, such as the magnetic field strength. In particular, an external magnetic field ($B_{external}$) will generate a torque ($\tau$) on the proof-mass 102 due to a remnant dipole ($m_m$) of the magnet. The torque is given by:

$$\tau = m_m \times B_{external} \quad (1)$$

The remnant dipole scales linearly with its dimensions (e.g., x, y, and z) and remnant magnetization ($B_r$), as shown by Equation (2):

$$m_m = x \cdot y \cdot z \cdot \frac{B_r}{\mu_r \cdot \mu_0} \quad (2)$$

The resulting torque can be measured in various ways to determine a component of the external magnetic field. In certain examples, an optical read-out can be used to measure the torque. In such examples, the proof-mass 102 can be constrained by a fixed spring on the Silicon structure 104, and an optical source (e.g., a laser) may direct optical radiation to and detect reflected radiation from the surface of the proof-mass 102. Deflection of the proof-mass 102 due to the torque causes deflection of the impinging optical beam and may cause the optical beam power to be preferentially split between two optical detectors. The dynamics of the MEMS resonator may be leveraged to amplify the motion of the proof mass. The different read-outs from the two detectors based on the different received optical power levels may be used to determine the torque, and from the torque, the magnetic field strength can be determined based on Equations (1) and (2) above. In such examples the substrate may be formed from transparent glass to permit displacement of the proof mass to be measured optically.

In the example shown in FIG. 1, the sensor 100 includes a frequency-based read out mechanism. In this example, the plurality of supports 106, 108, 110, 112 permit displacement of the proof-mass 102. The magnet generates a torque ($\tau$) in response to an external magnetic field (B), and in response to the torque, the supports 106, 108, 110, 112 go into tension and compression due to the imposed forces. The resonant frequency of each support beam changes with the imposed force, and therefore may be measured to determine the component of the received magnetic field.

In various embodiments, a MEMS comb drive 124 may be used to interface and measure the frequency of each support 106, 108, 110, 112 and thereby determine the imposed forces and resulting external field. The MEMS comb drive 124 may include electrostatic comb fingers and associated electronics. In certain examples, each comb drive 124 include a motor component and a sense component positioned on either side of the comb of the corresponding support 106, 108, 110, 112. A voltage applied by the motor component causes the motor component, comb, and sense component to be drawn together. The resonant frequency of each support 106, 108, 110, 112 is proportional to the force. Accordingly, respective comb drive capacitances may be used to measure the resonant frequency of the corresponding support 106, 108, 110, 112. Signals from the electronics of the MEMS comb drives 124 may be provided to external components or devices via the electrical contacts 120. Multiple independent supports 106, 108, 110, 112 and frequency measurements also enable two axes of acceleration and a common mode signal (temperature) to be measured with high precision. Frequency can be measured over a very large dynamic range, and provides the ability to resolve $fT/\sqrt{Hz}$ signals from a small device in the presence of a large variable field typical of a sensor being placed on a maneuvering vehicle. Further examples and discussion of a frequency-based read-out approach for a MEMS-based magnetic sensor are described in U.S. PG-Pub. No. 2017/0097394 published on Apr. 6, 2017, which is herein incorporated by reference in its entirety for all purposes.

A capacitive read-out mechanism may also be used. For example, one more capacitive plates may be used to capacitively sense movement of the proof-mass 102 and determine the torque. Examples and discussion of a capacitive read-out approach for a MEMS-based magnetic sensor are described in U.S. patent application Ser. No. 15/944,234 titled "MINIATURE MAGNETIC FIELD DETECTOR" and filed on Apr. 3, 2018, which is herein incorporated by reference in its entirety for all purposes.

Figure 2:
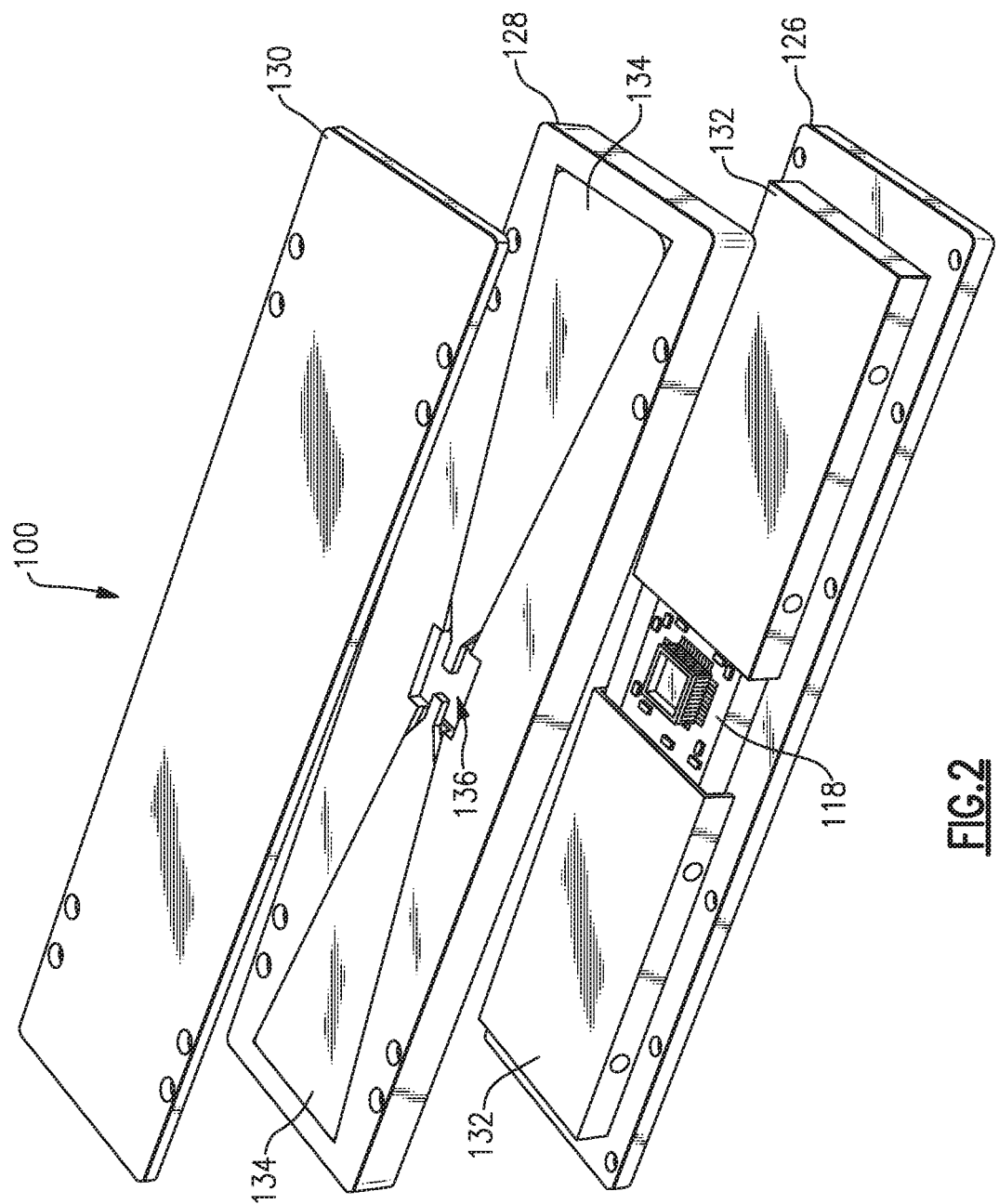
FIG. 2 is a diagram showing a partial exploded view of one example of a packaged magnetic sensor according to aspects of the present invention.

Referring to FIG. 2, the magnetic sensor 100 may be packed within a housing to reduce the presence of conductive materials near the sensor. In certain examples, the housing may facilitate a vacuum environment or cryogenic environment to further reduce damping effects within the sensor 100. In the example shown in FIG. 2, the housing includes a ceramic baseplate 126, and intermediate mounting surface 128, and a lid substrate 130. The lid substrate 130 may be made of Alumina or glass, for example. The shared substrate 118 may be attached to the ceramic base plate 126, as shown in FIG. 2. An internal shield 132 may extend from the ceramic base plate 126 to shield portions of the shared substrate 118 and reduce noise interference from electronic components of the sensor 100. In certain examples, the internal shield 132 may be composed of a non-conductive material with a high magnetic permeability. A MEMS process for a counterbalance (or countersink) may also be used to reduce mass imbalance which would introduce pendulous errors from vibration. As illustrated, in certain embodiments the packaged sensor 100 may include one or more field concentrators 134 positioned and arranged to focus the magnetic field on the proof-mass 102. For example, the field concentrators 134 may include various flux concentrators, such as soft magnetic materials. The field concentrators 134 may be positioned on the intermediate mounting surface 128 which is configured to rest on a top surface of the internal shielding 132. When coupled with the internal shielding 132, an opening 136 defined in the intermediate mounting surface 128 rests substantially proximate the proof-mass 102 so as to permit the receipt of magnetic radiation at a proof-mass 102.

Figure 3A:
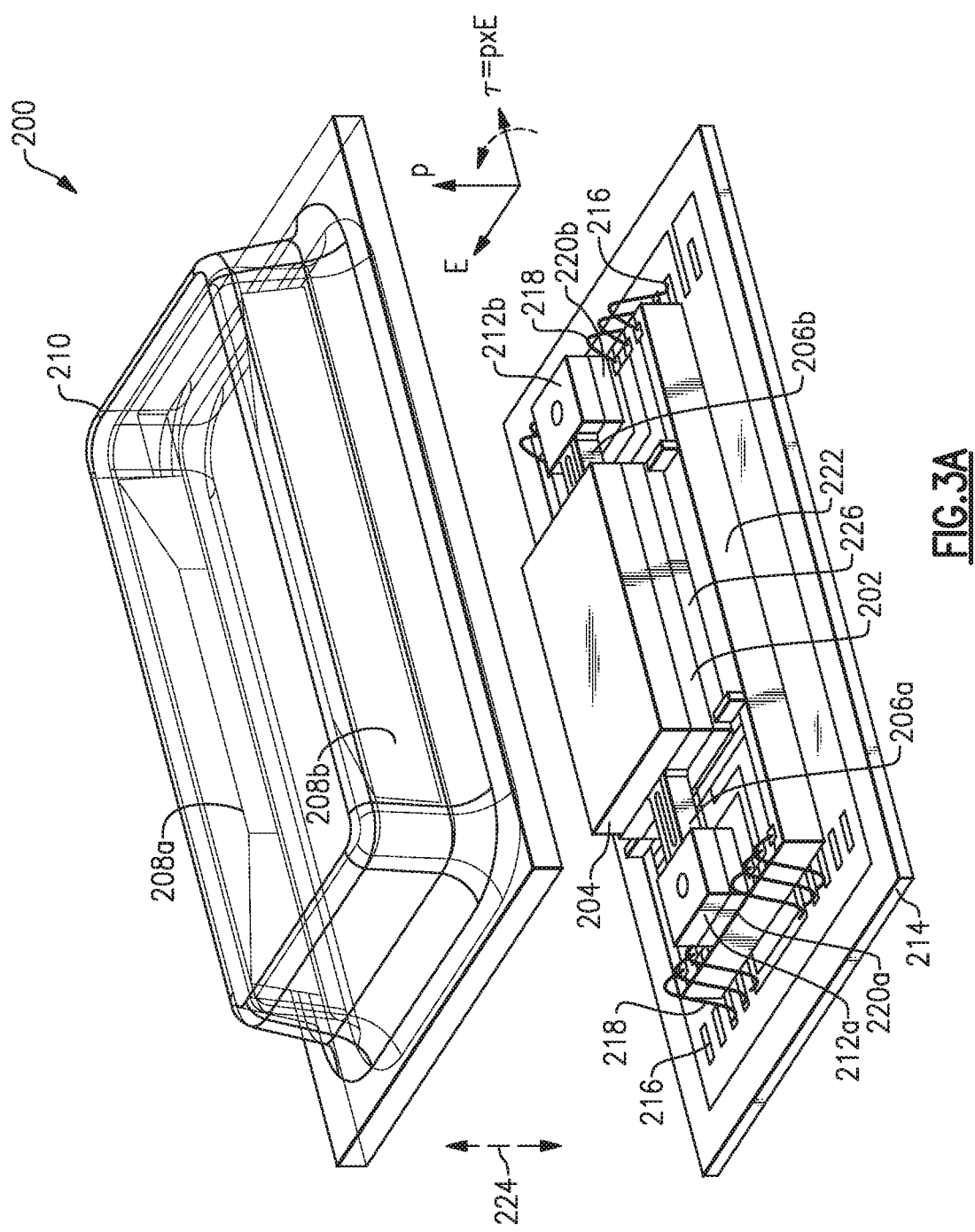
FIG. 3A is a diagram showing a partial exploded perspective view of one example of an electric field sensor according to aspects of the present invention.
Figure 3B:
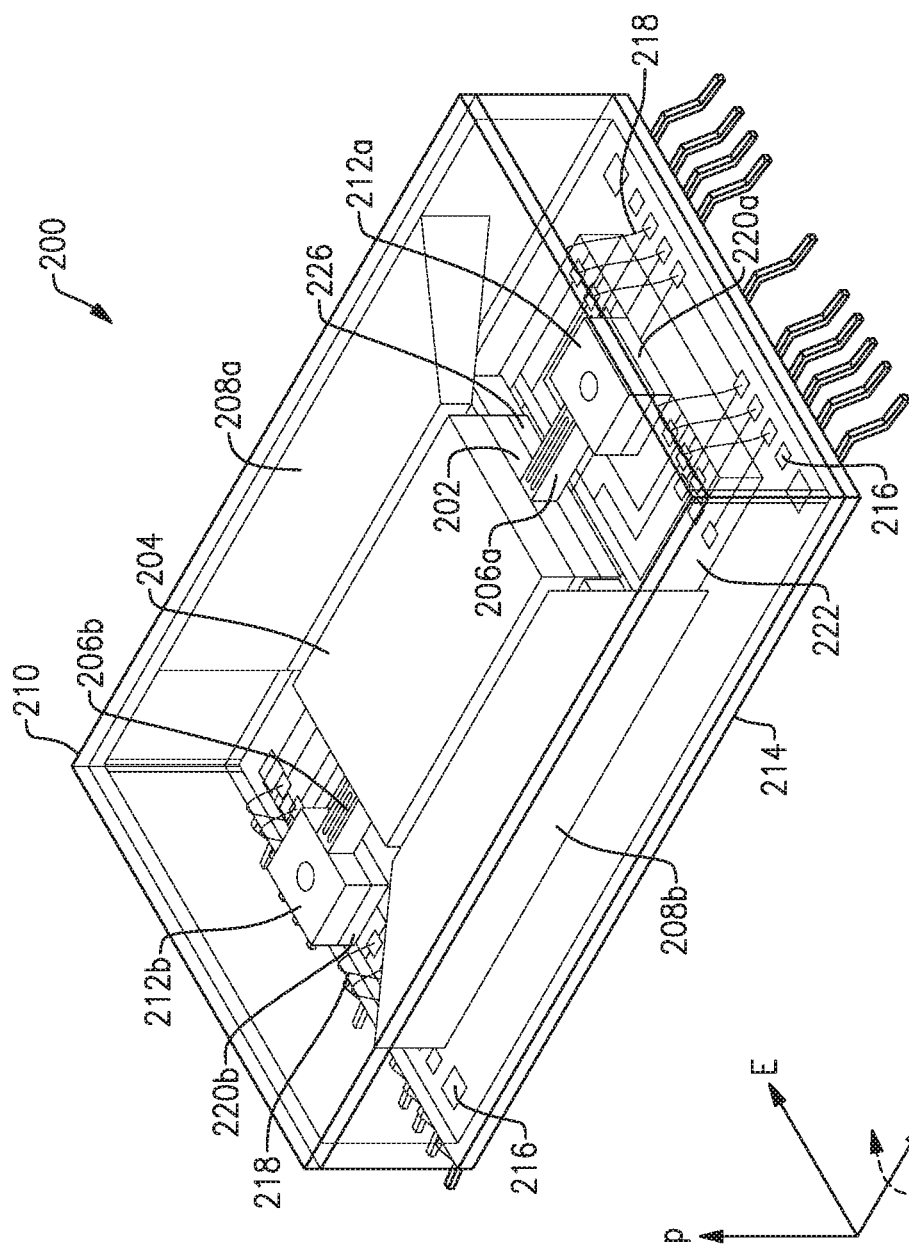
FIG. 3B is a diagram showing another perspective view of the electric field sensor of FIG. 3A.

As discussed above, various embodiments provide an electric field sensor. Embodiments of the electric field sensor may be constructed similar to the magnetic sensor discussed above, and may use a capacitive read-out to measure rotation of the proof mass. FIGS. 3A and 3B illustrate perspective views of an electric field detector 200 according to various examples described herein. FIG. 3A illustrates a view of the detector 200 with a housing 210 detached from the detector 200, and FIG. 3B shows a view of the detector 200 with the housing 210 attached. The housing 210 may be removed in a vertical direction away from the detector 200 (e.g., direction 224), as shown in FIG. 3A. The housing 210 may be made of Alumina or glass, for example.

In the example of FIGS. 3A and 3B, the electric field detector 200 includes a MEMS-based resonator, which may be defined by processing a structure wafer (e.g., a Silicon-on-Insulator wafer) to a desired geometry. As shown, the detector 200 may include a proof-mass 202 coupled to a source of concentrated charge 204, a plurality of supports 206a, 206b (collectively "supports 206"), one or more flux concentrators 208a, 208b (collectively "flux concentrators 208"), the housing 210, one or more anchors 212a, 212b (collectively "anchors 212"), a baseplate 214, one or more electrical contacts 216, one or more leads 218, and a substrate 222, among other components. While not shown in FIGS. 3A and 3B, each of the contacts 216 may couple the electric field detector 200 to a control circuit or other external circuitry or devices. In certain examples, the structure wafer is processed (e.g., etched) to define the proof-mass 202, the plurality of supports 206, and the one or more anchors 212. In further examples, the electric field detector 200 may also include one or more counterbalances 226 that are coupled to the proof-mass 202. As discussed above, the counterbalances, which may also be used in the magnetic sensor 100, may be used to reduce mass imbalance which would introduce pendulous errors from vibration. The flux concentrators 208 may reduce the effective noise floor.

In certain examples, the electric field detector 200 may also include one or more sense electrodes and one or more drive electrodes, each of which are positioned on the substrate 222 and obscured in FIGS. 3A and 3B by the counterbalance 226. As shown, the substrate 222 is positioned on the baseplate 214. The structure of the electric field detector 200 is similar in many ways to that of the magnetic sensor 100 discussed above, with the magnet replaced by the source of concentrated charge 204. In various examples, the source of concentrated charge 204 may include any suitable source of a semi-permanent static electric dipole, such as an electret or a capacitor plate having a residual free charge and/or polarization. As will be understood to one of ordinary skill in the art, the term "electret" refers to the electrical analog of a permanent magnet. The electret quasi-permanently traps large charge near the breakdown limit of the dielectric material. Examples of suitable electret materials include, but are not limited to, Polytetrafluoroethylene (PTFE), silicon nitride, Fluorinated Ethylene Propylene (FEP), a Perfluoro-alkoxy alkane (PFA) material, Cyptop, Cylotene, and other dielectrics. In certain examples the electret may include, but is not limited to, Thermo-electrets, MPEs (metal-polymer electrets), Radio-electrets, and Mechanoelectrets.

In various examples, the electric field detector 200 determines one or more characteristics of a received electric field, which one instance is a bio-electrical signal, based on measured capacitance variations due to torsional motion of the proof-mass 202 in response to receiving the electric field. While in some examples, a combination of linear forces may result in the torsional motion of the proof-mass 202, in certain other examples, a variation in capacitance as a result of a single linear force may be measured. The proof-mass 202 is supported by the plurality of supports 206, each of which form a rotationally compliant spring anchored to the substrate 222 via a respective anchor 212a, 212b. In the shown example, each support 206 is a flexured beam interposed between a side surface of the proof-mass 202 and a corresponding anchor 212a, 212b.

Still referring to FIGS. 3A and 3B, in various examples, the plurality of supports 206 may suspend the proof-mass 202 above a substrate offset space defined in the substrate 222. That is, the substrate 222 may include an area (referred to as a "substrate offset space") formed in a surface thereof beneath the proof-mass 202 (e.g., and counterbalance 226 shown in FIGS. 2A and 2B). The substrate offset space is obscured in FIGS. 3A and 3B by the counterbalance 226. While described as being suspended "above" the substrate offset space, in other examples, the proof mass 222 may be partially positioned within the substrate offset space. In other examples, the proof mass 202 may be positioned in close proximity to the substrate offset space but not directly above the substrate offset space. As discussed above, in certain examples, the electric field detector 200 may include one or more sense electrodes and one or more drive electrodes, each of which are positioned on the substrate 222 and in capacitive communication with the proof-mass 202.

In various examples an impinging electric field concentrated on the source of concentrated charge 204 generates a torque and effects motion of the proof-mass 202. For instance, the torque, τ, may be represented as:

$$\tau = p \times E \tag{3}$$

where, p, is the strength of the electric dipole from the source of concentrated charge 204 (e.g., in C-m) and, E, is the strength of the received electric field (e.g., in V/m).

In many instances, the proof-mass 202 responds to the torque by rotating about a torque axis (shown as axis τ in FIGS. 2A and 2B). In one example, the rotation can be represented as:

$$\theta = \frac{\tau}{(Is^2) + (Ds) + k} \tag{4}$$

where, θ, is the angle of rotation, τ, is the torque, I, is the polar moment of inertia, s, is the complex frequency, D, is a damping coefficient, and k is the rotational stiffness. In this way, the torque generated from the electric field induces motion in the proof mass 202, which reacts against the stiffness of the supports 206.

Embodiments of the electric field detector 200 include a capacitive read-out that is used to measure the torque induced by the electret coupled to the proof-mass 202. In various examples, the rotation of the proof-mass 202 increases or decreases the distance between the proof mass 202 and the sense electrode(s) positioned on the substrate 222. As the distance between the proof mass 202 and the sense electrode(s) increases or decreases, the relative capacitance between the sense electrode(s) and the proof mass 202 varies. The resulting change in capacitance can be measured by the electronics to estimate the characteristics of the received electric field.

Further examples and details of embodiments of electric field detectors with capacitive read-outs are described in U.S. patent application Ser. No. 15/944,106 titled "MINIATURE ELECTRIC FIELD DETECTOR" and filed on Apr. 3, 2018, which is herein incorporated by reference in its entirety.

According to certain embodiments, a gradiometer design starts with the fundamental building block of the torsionally operated electric or magnetic field sensor coupled to a readout of one or more capacitive sensor plates and/or electronics, similar to those discussed above with reference to the electric field detector 200. FIG. 4 is a diagram showing a perspective view of one example of a torsionally operated magnetic sensor incorporating a capacitive read-out according to certain embodiments. In this example, the magnetic sensor 300 includes the proof-mass 102 including a hard magnet, such as a Neodymium Iron Boron (NdFeB) magnet, placed on (or otherwise coupled to) a MEMS structure 302, which optionally includes a counterweight as discussed above. The proof-mass 102 rotates and generates a differential capacitance change which is measured by the electronics. Operation of the capacitive read-out is essentially the same as described above with reference to the electric field sensor 200, only the variations in capacitance provide magnetic field measurements rather than electric field measurements. The electronics provide force feedback via a set of electrodes positioned under the proof-mass 102 (and therefore not shown in FIG. 4) to rebalance the sensor against any external forces and torques. Electrical traces 304 for the capacitive sensor plates and/or electronics may be wire bonded to the ceramic baseplate 126 and coupled to through vias 306 to route electrical signals outside of the sensor package. The lid substrate 130, which may be a glass lid, may be bonded to the baseplate 126, optionally including a braze seal 308, to provide a vacuum environment which minimizes gas damping of the proof-mass 102 as discussed above. The structural supports (e.g., beams or springs) of the magnetic sensor 300 can be arranged, as discussed above, such that the proof-mass 102 is free to rotate about two axes such that it can measure the two vector components which are orthogonal to the magnetization direction of the magnet included in the proof-mass 102. To accommodate such an embodiment, the electrodes may be split.

Figure 5:
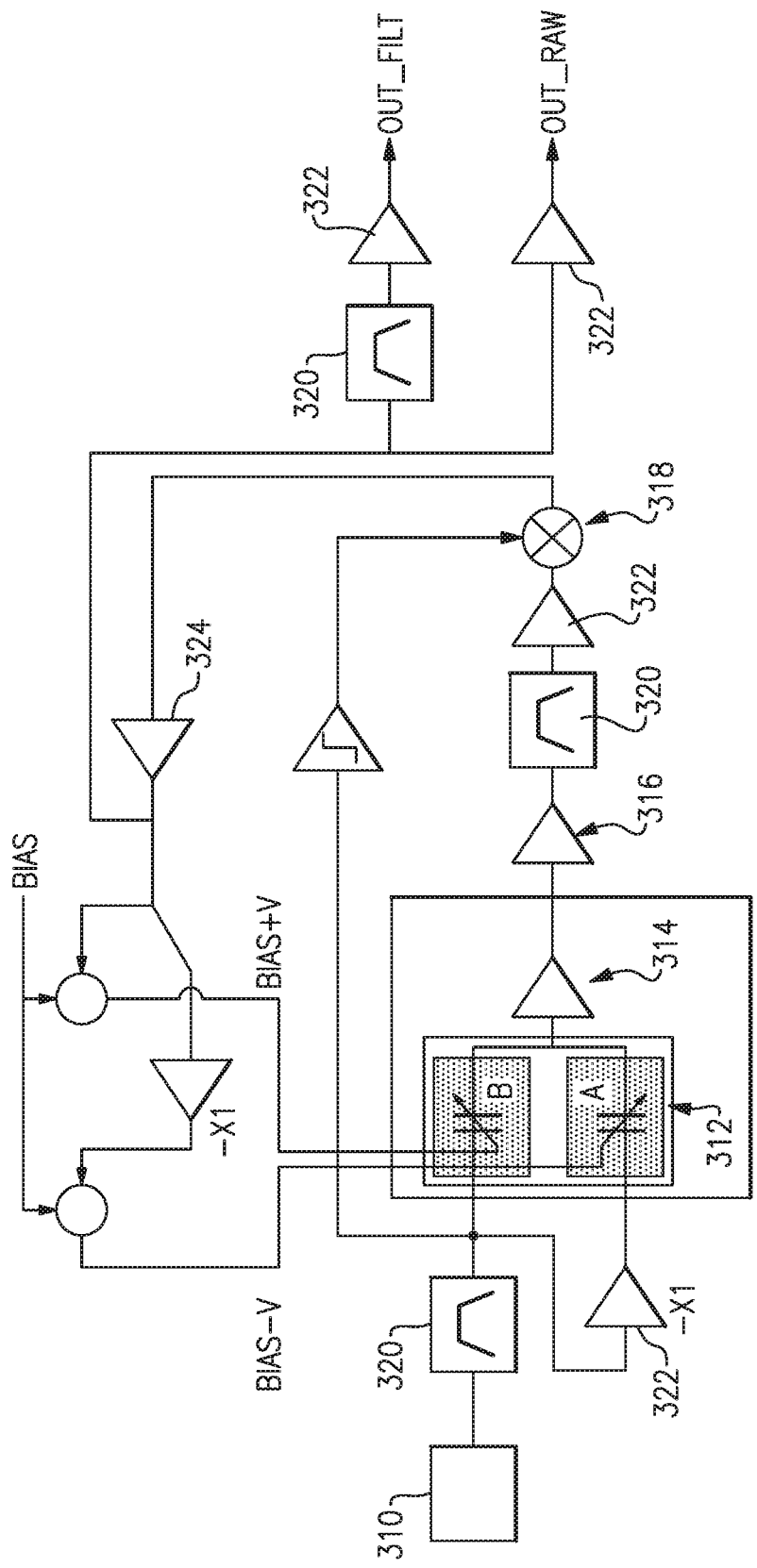
FIG. 5 is a simplified circuit diagram of one example of control electronics for a magnetic sensor and gradiometer according to aspects of the present invention.

FIG. 5 is a block diagram of one example of the electronics for the magnetic sensor 300. In various examples, the electronics (e.g., electrical readout circuitry) measures the differential capacitance due to changes in a gap between the Silicon structure 104 and the electrodes located on the substrate 116 below the proof-mass 102 (e.g., 3-5 microns below the proof mass). The electronics includes a precision carrier generator 310 that generates a low noise carrier signal. The low noise carrier signal and bias are applied to torsional magnetic transducers 312, which include the proof-mass 102 and MEMS structure 302, to up-convert the measured signal and avoid 1/f noise sources in the electronics. The measured signal from the magnetic transducers 312 is amplified, for example, by a pre-amplifier 314 and a low-noise AC-coupled instrumentation amplifier 316, and demodulated (represented at block 318) to recover the original (torque) signal. Filters, including filters 320 and optionally other filters not shown in FIG. 5, may be employed throughout the electronics to minimize out-of-band noise. Various additional amplifiers, including amplifiers 322 and optionally other amplifiers not shown in FIG. 5, may be employed throughout the electronics to adjust the power levels of the various signals, as will be appreciated and understood by those skilled in the art, given the benefit of this disclosure. After amplification and filtering, digital electronics can be employed for a variety of post-processing tasks and ultimate use. A loop controller 324 may be included and configured to adjust the bias and/or provide control signals to the transducers 312 and optionally other components of the electronics and magnetic sensor 300. In some examples, differential capacitors (A and B in FIG. 5) may be integrated on a single die. However, in other examples, differential measurements between multiple transducers 312 that are on separate dies may be used. Despite not being co-located, the transducers may be force coupled and operate as a single instrument.

Figure 6:
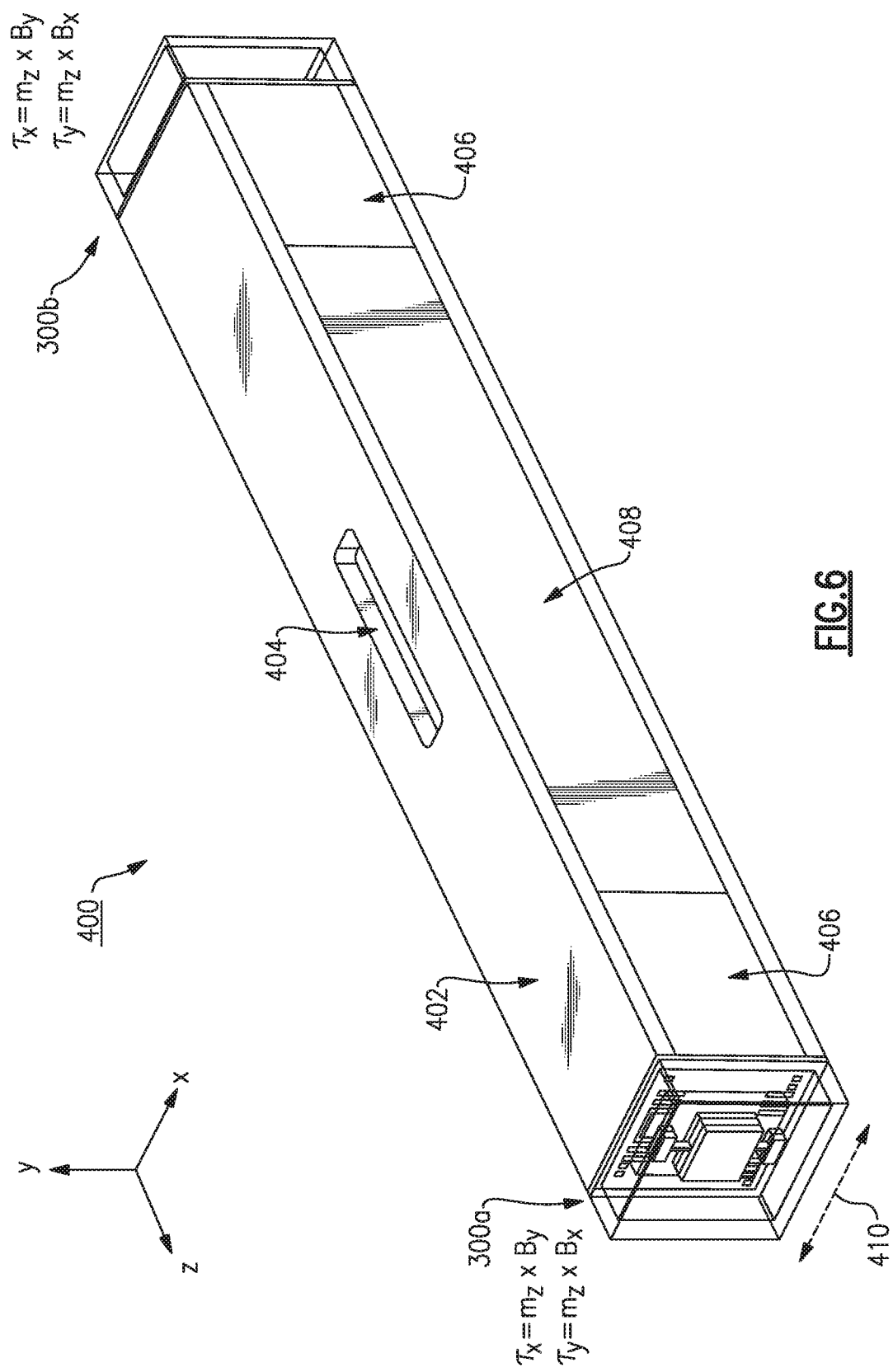
FIG. 6 is a block diagram one of example of magnetic gradiometer according to aspects of the present invention.

FIG. 6 is a diagram of one example of a magnetic gradiometer 400 configured to measure two B-field components and two gradients, according to certain embodiments. As discussed in more detail below, the integrated system provides electrical and magnetic coupling between two transducers 300a, 300b, along with force feedback, to generate low-noise magnetic field measurements over a wide dynamic range. According to certain examples, the magnetic gradiometer 400 is configured to difference the output from the two transducers 300a, 300b to obtain the gradient measurements. Scale factor variations from one transducer to the other may be addressed by electrically and magnetically coupling the two transducers 300a, 300b together, such that they can operate as an integrated gradiometer.

Referring to FIG. 6, in this embodiment, the magnetic gradiometer 400 includes the two magnetic transducers 300a, 300b, each of which may be an embodiment of the torsionally operated magnetic sensor 300 discussed above. Each transducer 300a, 300b can be configured to make differential capacitance measurements between capacitive plates disposed on opposite sides of the proof-mass 102 such that one capacitance increases and the other decreases due to rotation of the proof-mass 102, as discussed above. According to certain examples, the capacitive difference approach may be extended by taking capacitance measurements that are differenced between two transducers placed a distance apart. Thus, as shown in FIG. 6, the two transducers 300a, 300b may be placed at opposite ends of the housing structure. A circuit board 402 may link the two transducers 300a, 300b together, with the desired data easily extracted. The circuit board 402 may include edge connectors (not shown), and a connector port 404 for coupling the gradiometer 400 to external circuitry or devices. Each transducer 300a, 300b can be made to rotate in two axes (orthogonal to the magnetization along the long z-axis) and will therefore respond to external magnetic fields in the x- and y-axes.

Thus, from Equation (1) above, each transducer 300*a*, 300*b* provides torque measurements:

$$\tau_x = m_z \times B_y$$

$$\tau_y = m_z \times B_x$$

Each transducer 300*a*, 300*b* can be independently measured and provides two gradients (dBx/dz and dBy/dz) when differenced along the long (z) axis. Accordingly, two measurements of each gradient can be made, and can be averaged together to reduce the readout noise by √2 per axis. Variations from one transducer to the other are common mode to first order. In order to maximize scale factor stability, and absolute measurement accuracy, tunable bias voltages on the electrodes (e.g., torque plates) allow the scale factor to be measured and stabilized in a control loop, for, example, using the loop controller 324.

In various examples, the two transducers 300*a*, 300*b* are also magnetically coupled through a common reference structure. The magnets on each of the respective proof-masses 102, as well as reference magnets 406, are coupled along the long axis (z axis in the example illustrated in FIG. 6) of the reference structure and linked together through a high permeability shunt 408 that spans the remaining distance between the two sides. In one example the high permeability shunt 408 includes a soft ferrite cage that may also provide shielding for the electronics. The reference field from the reference magnets 406 mutually aligns each transducer 300*a*, 300*b* to a common vector such that all of their magnetic moments are aligned. The reference magnets 406 may produce fields which are a significant fraction of a Tesla in the vicinity of each transducer 300*a*, 300*b*. This acts as a strong magnetic spring since the field from the reference magnets 406 generates a restoring torque on the magnet of each proof-mass 102. For instance, a reference field of ~0.6 T produces a magnetic spring that yields a resonant frequency of greater than 1 kHz. This, along with any mechanical spring stiffness, works against the negative torque that is generated and enables large bias voltages to be placed on the respective capacitive plates. The electrostatic spring, generated by the bias voltage, can then be chosen to tune the natural frequency of each sensor support, with the ability to greatly increase the scale factor of the system while remaining structurally robust. For example, the device stiffness can be tuned by tuning the bias voltage under each plate in the transducers 300*a*, 300*b* to generate a negative stiffness which counteracts the mechanical stiffness of the system. This tunes the resonance and reduces the contribution of electronics noise in the resonance bands. In certain examples, the combined springs can be brought to near zero stiffness with properly applied voltage and control. However, a 3 dB broadband performance may be limited to a few hundred Hertz depending upon the specific design. Achieving equivalent noise at higher frequencies may be accomplished by reducing the bias voltage and tuning the natural frequency to the desired sense band. This allows the device to operate near its theoretical limit across a broad range of frequencies (>1 kHz).

A difference in the external torque between the two sensors (transducers 300*a*, 300*b*), due to a magnetic gradient, generates a differential capacitance that is exploited to directly measure the gradient. The interplay between the magnetic stiffness and electrical stiffness allows the sensor resonant frequency to be tuned. This can be employed to optimize the noise performance of the gradiometer 400 in selected bands, and can also be monitored to directly measure selected error terms. For instance, although uniform thermal changes may common mode (e.g., cancel) between two perfect transducers, thermal gradients and other imperfections may not. Since the magnetic moment in the torque equation is a function of temperature, thermal gradients may induce scale factor changes that leak through any differencing operation between sides and impact the absolute accuracy of the values measured. However minor changes in the magnetic moment, will also change the magnetic spring stiffness and the resonant frequency. This shift in resonant frequency can be precisely measured and can be used to directly remove scale factor variations. Therefore, the electrostatic and magnetic coupling serves to remove the most serious errors encountered when operating in a gradiometer mode. There is sufficient margin relative to the vacuum field emission limit (~200 MV/m) to provide a high enough tuning voltage to reduce the effective total stiffness. In addition, operating at lower stiffness may increase the scale factor and improve overall noise performance at lower frequencies. In certain examples, the electronics may provide feedback to linearize the output while tuning the natural frequency to maximize the scale factor for a given bandwidth.

According to certain examples, although the proof-masses 102 may be rebalanced via electrostatic feedback, there may still be some level of motion that will generate variable fields nearby. This intrinsically is not a problem, since the mechanical structures (e.g., supports) and/or electrostatic force feedback in each transducer 300*a*, 300*b* can counter the static fields from the reference magnets 406, which approach a fraction of 1 T. However, residual motion from the force feedback loop, or if a sensor is run in an open loop condition, may generate field variations in transducers immediately nearby if a large signal is present (e.g., large maneuvers in the Earth field). In various examples, this effect may be eliminated by ensuring the force feedback dynamics minimize residual motion. However, in other examples, all of the values may be measured and solved for the cross coupling (e.g., in post-processing) to correct for the cross talk. This may, in essence, be a magnetic amplifier and produce a scenario where the response of the center array element would scale as k*N where k is the coupling factor, which may be greater than 1 for closely spaced geometries. In comparison, the noise on the center element does not change so there is a net gain in the signal-to-noise ratio (SNR) which scales as N.

Embodiments of the gradiometer 400 can be integrated into a compact package. For example, embodiments of the gradiometer 400 may have a dimension 410 that is on the order of 1 cm.

The performance of the gradiometer 400 was evaluated by modeling major error sources and other performance contributors. A one degree of freedom model describing the scale factor (SF; rad/T) dynamics of a single-sided MEMS device, such as in the gradiometer 400, is:

$$SF = \frac{x_m \cdot y_m \cdot z_m \cdot \frac{B_m}{\mu_0}}{I \cdot s^2 + D \cdot s + k_{mech} + k_{mag} + k_{vbias}} \quad (5)$$

In Equation (5), I is the polar moment of inertia of the rotating structure, s is the complex frequency, D is the damping due to losses in the system, kmech is the mechanical stiffness of any flexure supports, kmag is the magnetic spring stiffness, and kVbias is the spring stiffness of the electrostatic spring due to the applied voltage between the proof-mass 102 and the electrodes. The mechanical and magnetic stiffnesses are positive, while the electrostatic stiffness is negative. In an open loop configuration, the combined mechanical and magnetic stiffness must be larger than the electrostatic stiffness to avoid an unstable configuration where the two capacitive plates snap down to their mechanical limit. Closed loop feedback control allows the system to operate in unstable regimes and achieve a higher scale factor with resulting performance benefits.

The mechanical stiffness (kmech) is fixed by the mechanical design of the support structure, and the magnetic stiffness is set by the proximity of the transducer 300a or 300b to the reference magnets 406 and the resulting field magnitude. However, the voltage bias can be tuned with high precision which gives the ability to arbitrarily generate a desired stiffness and corresponding scale factor. Low loss structures common in vacuum packaged MEMS devices, can have a distinctive resonant frequency with a large response around its natural frequency where the input is also mechanically amplified. This frequency region, with high scale factor, can be arbitrarily tuned with the maximum frequency limited by the mechanical and magnetic stiffness available. However, there is a tradeoff between scale factor and bandwidth where low stiffness structures mechanically filter frequencies about 2× above their resonant frequency.

Figure 7:
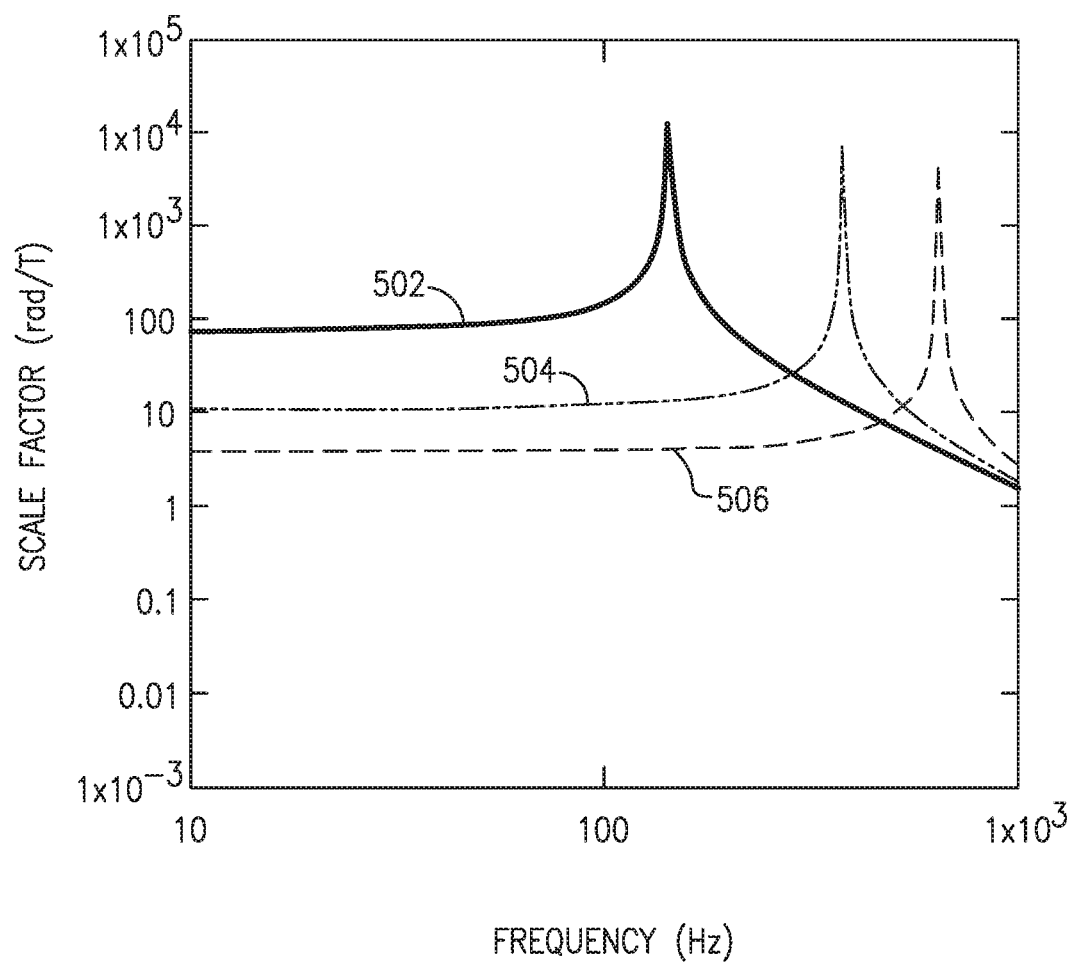
FIG. 7 is a graph showing simulated measurements of scale factor as a function of frequency for different bias voltages in a modeled example of a magnetic gradiometer according to aspects of the present invention.

According to certain embodiments, small, millimeter-scale proof-masses 102 can be tuned over a frequency range of approximately 0 Hz (DC) to 1 kHz while maintaining an acceptable scale factor and bias voltage. FIG. 7 is a graph showing the simulated scale factor (SF) as a function of frequency for various bias voltages. Curve 502 corresponds to a bias voltage of 35 volts (V); curve 504 corresponds to a bias voltage of 32 V; and curve 506 corresponds to a bias voltage of 24 V. In this example, the magnetic field sensor 300 included an NdFeB magnet having dimensions 5 mm by 5 mm by 2 mm, and the reference magnet field strength was 0.5 T. Higher bias voltages improve electronics noise and scale factor at low frequencies by reducing the total stiffness to near zero. Reducing the bias voltages sacrifices performance at low frequencies, but expands the operational bandwidth of the device. In particular, at higher frequencies, superior noise performance may be achieved by operating around the resonant peak and then applying a whitening filter to normalize the amplitude and phase response output. It should be noted that at the highest scale factors, the available travel in the capacitive gap may cause the device to snap down if the background Earth field is aligned with the input axis. This can be addressed by operating with closed loop feedback control to rebalance the sensor, or by operating open loop with lower bias. Thus, the bias voltage and scale factor, combined with other parameters of the gradiometer design, determine the noise floor. Contributors to noise include Brownian noise, noise from the pre-amplifier 314 and other electronics, external and self-generated magnetic noise, and hysteresis noise from the high permeability shunt 408.

Brownian noise is the fundamental limit of the sensor regardless of the instrument scale factor since the dynamics of the sensor respond to the resulting torque noise. Brownian noise generally describes the noise floor of the device operating near its resonant peak. The magnitude of the thermo-mechanical agitation is dictated by losses in the system. Losses can be reduced by vacuum packaging the sensor, as discussed above. Mechanical losses in the Silicon/MEMS structure, including the supports, can be addressed by using a control loop with upper and lower sense plate electrodes to electrostatically levitate the magnet. In this case, losses may be limited by the magnet motion which induces eddy currents in nearby conductors, or exercises the hysteresis loop of nearby soft magnetic materials (such as the high permeability shunt 408). Laminations and/or low conductive materials nearby (e.g. ceramic magnets and packaging can be used to control these losses.

Voltage and current noise from the pre-amplifier 314 also limit the broadband noise of the magnetic sensor 300, such that large pick-off capacitors may be used. Movements of the proof-mass 102 may induce a current due to the variable capacitance with a bias applied across it. Performance may improve with higher scale factors and bias voltages. In certain examples, stray capacitance can be minimized throughout the signal chain. A carrier frequency (e.g. 10 kHz) and subsequent demodulation back to baseband, as discussed above with reference to FIG. 5, may be used to avoid 1/f amplifier noise sources at low frequencies. Other components in the electronics and structure of the magnetic sensor 300 can also produce noise in the measurements. For example, voltage noise on any of the capacitive plates generates differential forces that move the proof-mass 102 and appear as a sensor input if they fall in the sense bandwidth. Filtering and noise control of the bias voltage can partially help, but may not completely eliminate this noise source. For example, noise on any torque feedback plates is in-band by definition, and may be controlled by minimizing the voltage noise applied on the torque plates. Increasing the capacitive gap extends the dynamic range and reduces the force, but also reduces scale factor which impacts broadband noise performance. Johnson noise from conductors in the transducers 300a, 300b or other components in the gradiometer 400 can also impact performance. Conductors relatively close to the proof-masses 102 may generate thermally induced eddy currents which produce magnetic noise. This may be generally avoided by using non-conductive (e.g. glass) packaging and structures in the vicinity of the proof-mass 102. However, it may be necessary for conductive surfaces, such as the electrodes and other electrical traces, to be in close proximity to the proof-mass 102. For example, a 100 nm thick electrode plated to the top of the substrate 118 may generate more than 6 pT/√Hz of in-band noise at the bottom of the MEMS structure 302 and 165 fT/√Hz when integrated through the volume. To address this noise source, in certain examples, the conductivity of the electrical traces may be reduced by about four orders of magnitude and/or slots may be added to reduce enclosed eddy current paths. The resulting trace resistance remains less than the ~1 kohm limit of the electronics, while reducing the integrated gradiometric noise to less than 0.25 fT/cm/√Hz.

As discussed above, operating the magnetic field sensors as a gradiometer removes external magnetic noise (clutter) to the first order. However, the sensor electronics may generate large gradients that may need to be reduced or controlled. According to certain embodiments, the sensor electronics that are located in proximity to the proof-mass 102 and MEMS structures may be placed in an internal shielded cavity, as discussed above, to reduce the effects of self-generated noise. Control circuitry of the gradiometer 400 external to the transducers 300a, 300b may also be enclosed by magnetic shielding and connected by twisted pair wires to avoid generating interference at the transducers 300a, 300b.

In certain implementations, hysteresis noise from the high permeability shunt 408 may induce noise into the transducers 300a, 300b. For example, this may be observed when the flux concentrators 134 are integrated and placed close to the transducers. However, including the flux concentrators 134 may still be advantageous if the concentrator geometry provides sufficient gain to compensate for the additional noise.

Figure 8A:
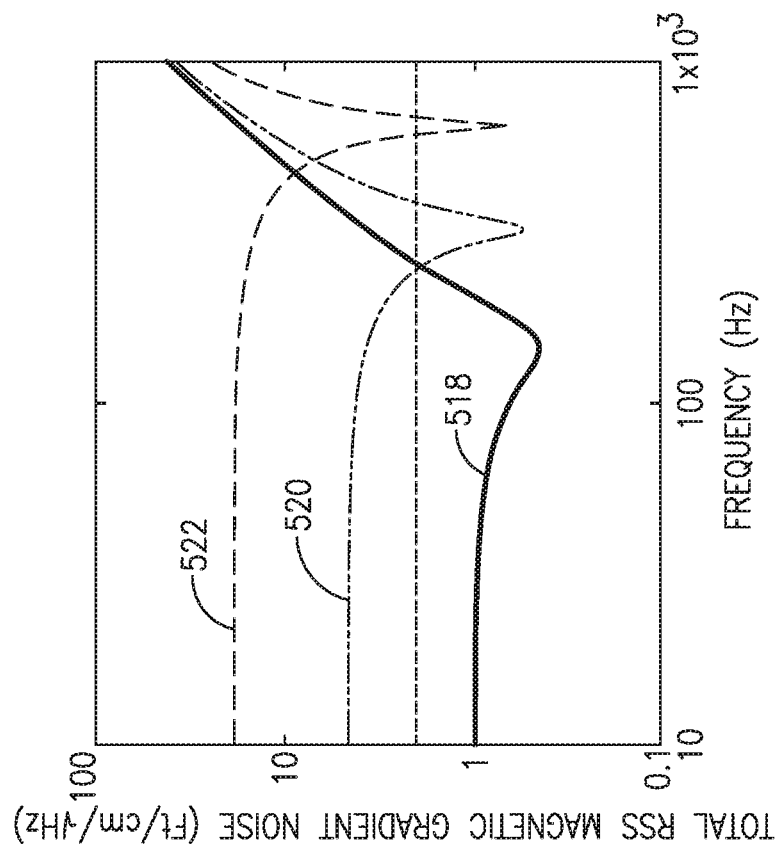
FIG. 8A is a graph showing simulated measurements of various sources of magnetic noise in a modeled example of a magnetic gradiometer according to aspects of the present invention.
Figure 8B:
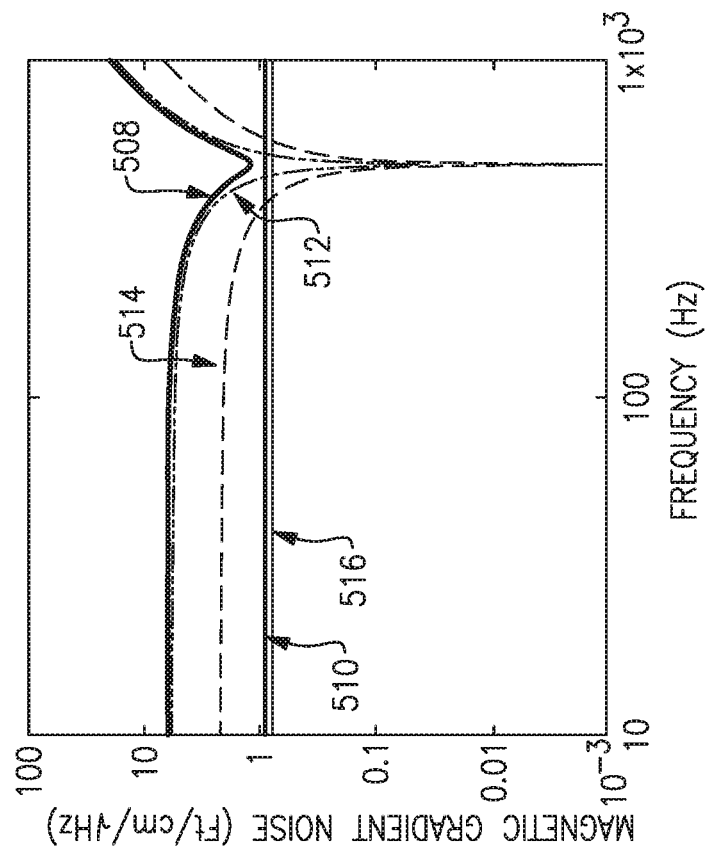
FIG. 8B is a graph showing simulated measurements of the total magnetic noise for different bias voltages in the modeled example of a magnetic gradiometer according to aspects of the present invention.

Analytical models for each of the non-system related noise sources were generated to estimate the performance of the gradiometer 400. A separation of 6.5 cm, with a maximum package area of 1 cm², was modeled to ensure that a gradiometer 400 with a compact design could operate on a wide range of platforms. FIGS. 8A and 8B are graphs showing simulation results for a modeled example of the gradiometer 400. FIG. 8A is a graph of simulated magnetic gradient noise (fT/cm/√Hz) as a function of frequency (Hz). For the simulation that produced the results shown in FIG. 8A, the magnet (of the proof-mass 102) was modeled as an NdFeB magnet having dimensions 5 mm by 3 mm by 0.4 mm, the reference magnetic field ($B_{ref}$ from the reference magnets 406) was 0.5 T, $f_{mech}$=400 Hz, and the bias voltage was 26 V. In FIG. 8A, curve 508 represents the total RSS magnetic gradient noise, curve 510 represents the Brownian noise, curve 512 represents the pre-amplifier 314 voltage noise, curve 514 represents the pre-amplifier 314 current noise, and curve 516 represents the noise from the signal generator 310 force.

FIG. 8B shows simulation results for a configuration on the gradiometer 400 where an electrostatic spring optimizes performance to achieve lower noise by operating in narrow-band mode at higher frequencies. FIG. 8B is a graph showing the total RSS magnetic gradient noise as a function of frequency (corresponding to curve 508 in FIG. 8A) for different bias voltages. In FIG. 8B, curve 518 corresponds to a bias voltage of 35 V, curve 520—corresponds to a bias voltage of 33 V, and curve 522 corresponds to a bias voltage of 24 V. As shown in FIG. 87B, the frequency band, with low noise performance, can be chosen by selecting the bias voltage. For the simulation results presented in FIG. 8B, the gradiometer 400 was modeled with an NdFeB magnet having dimensions 5 mm by 5 mm by 2 mm, $B_{ref}$=0.5 T, and $f_{mech}$=0 Hz.

Figure 9:
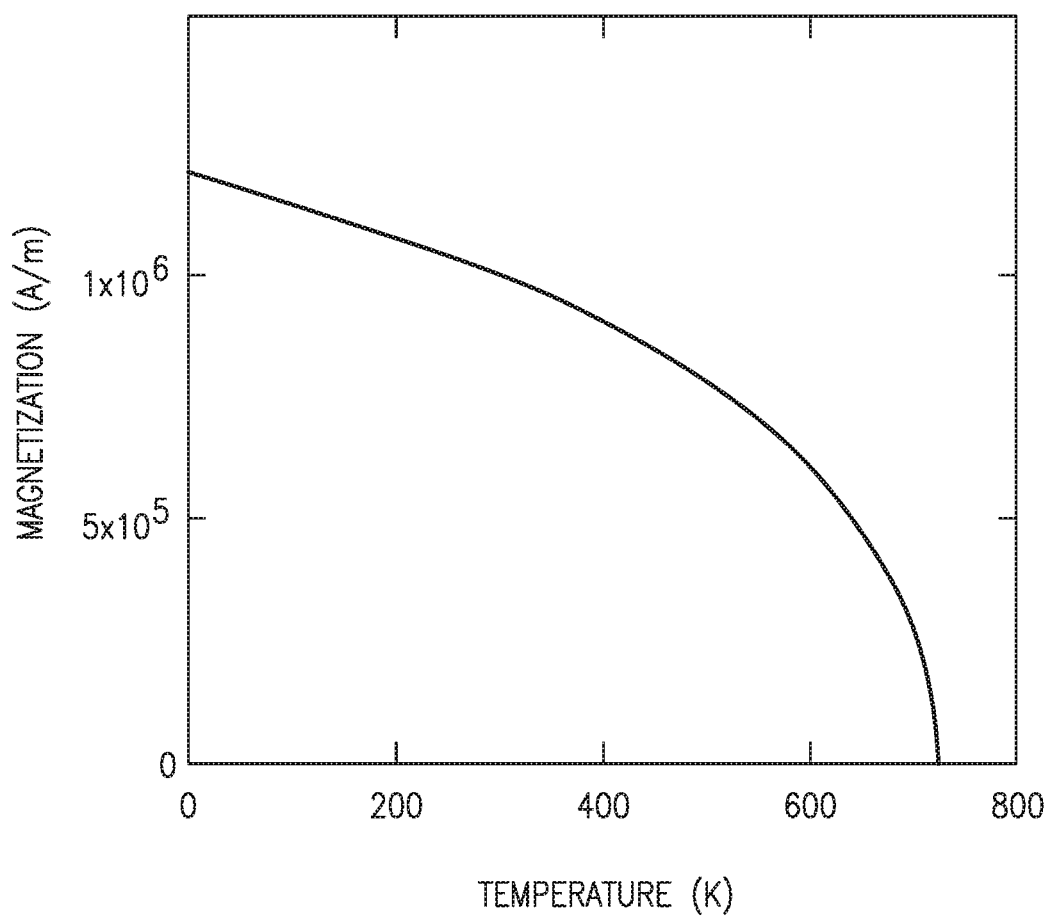
FIG. 9 is a graph showing the temperature dependence of the magnetization in a modeled example of a magnetic gradiometer according to aspects of the present invention.

Referring again to FIG. 6, both magnetic sensors 300a, 300b may common mode (cancel) uniform temperature deviations, and thermal gradients may influence the thermal stability limit of the gradiometer 400. The scale factor described in Equation (5) is driven by magnetization magnitude of the permanent magnet material. As the temperature approaches the Curie point of the material, thermal agitation introduces instabilities which cause the internal magnetic dipoles to lose alignment and reduce the net magnetization, as shown in FIG. 9. Around room temperature, typical hard magnets have a sensitivity of approximately −0.1%/K. Thermal control, or compensating to better than 1 mK, as may be desired for certain application, may be very challenging. According to certain embodiments, stability may be maintained without requiring precision thermal control or calibration by leveraging the fact that the magnetization impacts stability more than the DC scale factor. The magnetization directly influences the magnetic spring stiffness which is a product of the remnant magnetization of the transducers 300a, 300b and the restoring field provided by the reference magnets 406. This, in conjunction with the structural stiffness, has a ~10 PPM/K sensitivity due the sensitivity of the elastic modulus to temperature, directly impacts the resulting scale factor. Advantageously, these factors also influence the resonant frequency which can be easily monitored in a high-Q resonator. The scale factor sensitivity can be controlled by adjusting the bias voltage to maintain the resonant frequency at a chosen value. The scale factor can therefore be stabilized to within the limits of the frequency measurement and control.

In various applications, including, for example, using aerial surveillance from a mobile platform to identify submerged targets, it can be highly advantageous to recover the full magnetic gradient tensor. For example, recovering the full magnetic gradient tensor may mitigate noise associated with the environment (e.g. local geology noise) and the dynamics of the platform itself, and may also provide the capability to directly solve for the source dipole magnitude, location, and orientation which provides orthogonal information to separate clutter sources from small target anomalies. These additional degrees of freedom may also be used in advanced clutter suppression algorithms. In biophysical applications, such a magneto-encephalography (MEG), the vector gradients may provide the ability to better localize correlated dipole layers in the cortex.

According to certain embodiments, the gradiometer 400 can be configured into a multi-element array to allow for recovery of the full gradient tensor. For complete definition of the full gradient tensor, there are nine gradient terms and three field magnitudes:

$$\begin{bmatrix} \frac{\delta B_x}{\delta x} & \frac{\delta B_x}{\delta y} & \frac{\delta B_x}{\delta z} \\ \frac{\delta B_y}{\delta x} & \frac{\delta B_y}{\delta y} & \frac{\delta B_y}{\delta z} \\ \frac{\delta B_z}{\delta z} & \frac{\delta B_z}{\delta y} & \frac{\delta B_z}{\delta z} \end{bmatrix}^{-1} \cdot \begin{pmatrix} B_x \\ B_y \\ B_z \end{pmatrix} \quad (6)$$

However, there is redundancy in the matrix. Gauss's Law and Ampere's Law can be employed to show that the nine gradient terms only require five unique measurements to completely define the matrix since, $$\nabla \cdot \vec{B} = \frac{\delta B_x}{\delta x} + \frac{\delta B_y}{\delta y} + \frac{\delta B_z}{\delta z} = 0 \quad (7)$$

and, $$\nabla \times \vec{B} = \mu_0 j + \mu_0 \varepsilon_0 \frac{\delta E}{\delta T} \approx 0 \approx \begin{bmatrix} \frac{\delta B_z}{\delta y} - \frac{\delta B_y}{\delta z} \\ \frac{\delta B_z}{\delta x} - \frac{\delta B_x}{\delta z} \\ \frac{\delta B_y}{\delta x} - \frac{\delta B_x}{\delta y} \end{bmatrix}. \quad (8)$$

Figure 10:
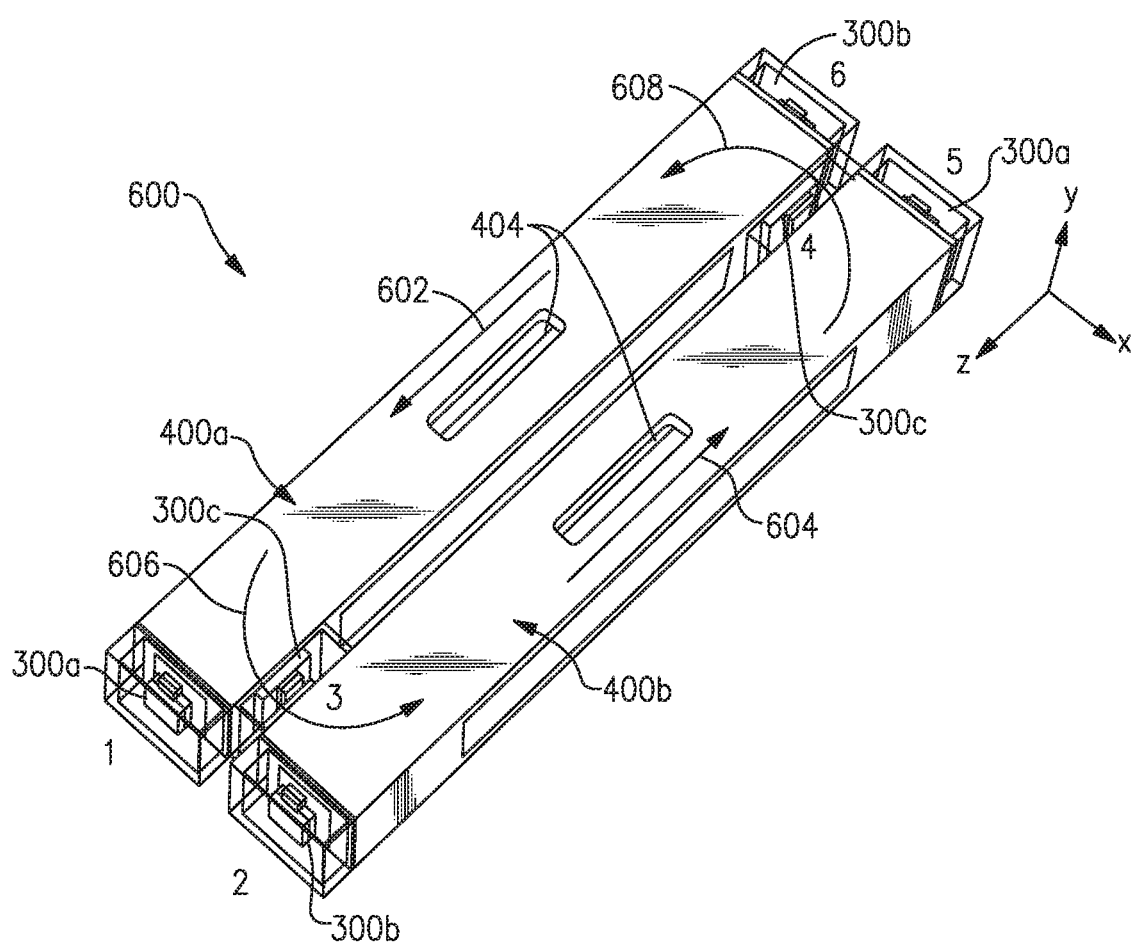
FIG. 10 is a block diagram of one example of a gradiometer array include a pair of magnetic gradiometers according to aspects of the present invention.

FIG. 10 shows an example a two-element array 600 that be used for full gradient tensor extraction. The two-element array 600 has the ability to measure all the components of the gradient matrix and vector field which completely defines the magnetic potential. In the example shown in FIG. 10, the gradiometer array 600 includes two single-axis gradiometers 400a, 400b, each of which corresponds to an embodiment of the gradiometer 400 discussed above. The two gradiometers 400a, 400b are placed next to one another, but oriented in opposite directions to exploit the shunt return path for the reference magnets 406 in each segment. Arrows 602, 604, 606, and 608 illustrate the magnetization vectors. The magnetization vectors are co-linear in the z direction, which prevents the measurement of the magnetic field in this direction (Bz). However, as shown by arrows 606 and 608, the field lines bend around the corners such that a transducer 300c placed at the ends of the array 600 in the orthogonal direction to the other transducers 300a, 300b, will be magnetized in the +/−x direction, enabling the measurement of Bz as well as a redundant measurement of By. The six transducers 300a, 300b, 300c (labeled 1-6 in FIG. 10) can be connected and differenced such that the array 600 provides eleven independent gradient measurements (including six redundant measurements) and twelve field vectors measurements (including redundant measurements). For example, the $$\frac{\delta B_x}{\delta x}$$

gradient measurement can be obtained by differencing the measurements from transducers 1 and 2 or 5 and 6; the $$\frac{\delta B_z}{\delta z}$$

gradient measurement can be obtained by differencing the measurements from transducers 3 and 4; the $$\frac{\delta B_y}{\delta x}$$

gradient measurement can be obtained by differencing the measurements from transducers 1 and 2 or 5 and 6; the $$\frac{\delta B_y}{\delta z}$$

gradient measurement can be obtained by differencing the measurements from transducers 1 and 6, 2 and 5, or and 3 and 4; and the $$\frac{\delta B_x}{\delta z}$$

gradient measurement can be obtained by differencing the measurements from transducers 1 and 6, 2 and 5, or 3 and 4. In certain examples the measurement of the dx gradient may be slightly degraded by the smaller baseline, which can be improved by increasing the separation between each gradiometer 400a, 400b of the array 600.

According to certain embodiments, any number of gradiometers 400 can be integrated to achieve multi-element arrays that can be used for a variety of applications. For example, larger two- or three-dimensional arrays, with greater spatial coverage, can be combined in a 2D checkerboard pattern that leverages symmetries. Differences can then be taken between many different transducers on different gradiometer elements of the array to derive higher order spatial gradient terms.

As discussed above, examples of the magnetic gradiometers, gradiometer systems or arrays, and related methods described herein offer various benefits over typical magnetometers. For instance, examples described herein can recover the full gradiometric tensor, which can be leveraged to reject clutter, identify a signal, and localize a source. A full tensor solution provides a significant amount of additional information relative to scalar data alone, and eliminates ambiguities in knowledge of the local field. In various examples, the electrostatic/magnetic spring system described herein permits performance to be finely tuned with the ability to trade bandwidth and noise. In various examples, the magnetic components stiffness correlates to scale factor. Accordingly, absolute measurement sensitivities and other effects can be removed by monitoring the natural frequency of the resonant system and using voltage feedback in the tunable spring to maintain a constant scale factor over other changes which influence stability and performance.

Various examples described herein are also less expensive than traditional magnetometer systems and do not require precision optical or other expensive components to operate the system. In particular examples, the described MEMS-based sensors are intrinsically small and low-power. For example, an entire gradiometer system (including all support components) can be scaled from <2 cm to larger volumes to optimize performance to a desired noise floor.

Certain examples may also offer the benefit of integrated shielding. For instance, the magnetic gradiometer may have a cavity in an internal shunt that also doubles as a magnetic shield to minimize coupling between noise sources in the proximity to the electronics and the transducers of the magnetic gradiometer. In some examples, the sensors can be intentionally coupled via magnetic interactions with nearby sensors to enhance signal recovery and reduce the effective noise floor. The sensors can also provide the full vector magnetic field at high precision and with low noise (−10 fT/√Hz) to aid in localization and other algorithms. The described designs can also be extended to other sensor modalities, such as an electric field, by replacing the magnetic dipole with an electric dipole. The combined system can directly measure the Poynting vector and deduce the direction to a source dipole.

According to certain embodiments, an electric field gradiometer is formed analogously to the magnetic sensor variant by replacing materials with their electrical counterparts. For example, the magnetic dipole formed from a permanent magnet is replaced with an electric dipole such as an electret, while high permeability magnetic material is replaced with a high dielectric constant or metallic material. Otherwise the functionality of the sensor and gradiometer are equivalent. Thus, referring again to FIG. 6, an electric field gradiometer may be formed using electric field sensors 200 instead of the magnetic field sensors 300a and 300b, along with the other replacements discussed above. Similarly, an electric gradiometer array analogous to the magnetic gradiometer array illustrated in FIG. 10 can be implemented as discussed above. Combining arrays of magnetic and electric gradiometers provides the ability to resolve the Poynting vector using all magnetic and electric field components. Thus, an integrated electromagnetic gradiometer array can be formed from integrating multiple magnetic sensors 300, electric field sensors 200, and/or gradiometers 400.

Having described above several aspects of at least one example, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. A gradiometer system comprising:
   at least two magnetic gradiometers, each magnetic gradiometer including:
     a first torsionally operated microelectromechanical systems (MEMS) magnetic sensor having a first magnetic field capacitive read-out configured to provide a first measurement of a received magnetic field,
     a second torsionally operated MEMS magnetic sensor coupled to the first torsionally operated MEMS magnetic sensor and having a second magnetic field capacitive read-out configured to provide a second measurement of the received magnetic field, and
     magnetic sensor control electronics coupled to the first and second torsionally operated MEMS magnetic sensors and configured to determine a magnetic field gradient of the received magnetic field based on the first and second measurements from the first and second torsionally operated MEMS magnetic sensors;
   at least one torsionally operated MEMS electric field sensor having a first electric field capacitive read-out configured to provide a first measurement of a received electric field; and
   at least one additional torsionally operated MEMS magnetic sensor having a third magnetic field capacitive read-out configured to provide a corresponding at least one additional measurement of the received magnetic field.

2. The gradiometer system of claim 1 wherein each of the first and second torsionally operated MEMS magnetic sensors includes:
   a proof-mass;
   a magnetic dipole source coupled to the proof mass;
   a substrate having a substrate offset space defined therein, wherein the proof-mass is suspended above the substrate offset space; and
   a first sense electrode disposed on the substrate within the substrate offset space and positioned proximate the proof-mass, the first sense electrode being configured to measure a change in capacitance relative to the proof mass from torsional movement of the proof-mass in response to the received magnetic field at the magnetic dipole source.

3. The gradiometer system of claim 2 wherein each of the first and second torsionally operated MEMS magnetic sensors further includes a counterbalance coupled to the proof-mass, wherein the magnetic dipole source is coupled to a first surface of the proof-mass and the counterbalance is coupled to a second surface of the proof-mass distal the magnetic dipole source.

4. The gradiometer system of claim 2 wherein each of the first and second torsionally operated MEMS magnetic sensors further includes a second sense electrode disposed on the substrate, and wherein the first sense electrode and the second sense electrode are configured to provide a differential capacitance measurement based on the change in capacitance from the torsional movement of the proof-mass.

5. The gradiometer system of claim 2 wherein each of the first and second torsionally operated MEMS magnetic sensors further includes at least one drive electrode positioned proximate the proof-mass and configured to produce a feedback torque on the proof-mass.

6. The gradiometer system of claim 2 wherein the magnetic dipole source is a permanent magnet.

7. The gradiometer system of claim 6 wherein the permanent magnet is a Neodymium Iron Boron (NdFeB) rare Earth permanent magnet.

8. The gradiometer system of claim 2 wherein each of the first and second torsionally operated MEMS magnetic sensors further includes at least one support coupled to the proof-mass and configured to suspend the proof-mass above the substrate offset space.

9. The gradiometer system of claim 8, each magnetic gradiometer further comprising an electronic feedback loop configured to stabilize a scale factor of the magnetic gradiometer by monitoring and adjusting a resonant frequency of the at least one support.

10. The gradiometer system of claim 1, each magnetic gradiometer further comprising a circuit board that electrically couples the first torsionally operated MEMS magnetic sensor to the second torsionally operated MEMS magnetic sensor, wherein the control electronics is formed on the circuit board.

11. The gradiometer system of claim 10, each magnetic gradiometer further comprising a reference structure that magnetically couples the first torsionally operated MEMS magnetic sensor to the second torsionally operated MEMS magnetic sensor.

12. The gradiometer system of claim 11, each magnetic gradiometer further comprising a plurality of reference magnets that produce at least one reference magnetic field configured to mutually align the first and second torsionally operated MEMS magnetic sensors to a common vector such that their magnetic moments are aligned.

13. The gradiometer system of claim 12, each magnetic gradiometer further comprising a high permeability shunt that couples together the first and second torsionally operated MEMS magnetic sensors and the plurality of reference magnets.

14. The gradiometer system of claim 13 wherein the high permeability shunt includes a soft ferrite cage configured to provide shielding for the control electronics.

15. The gradiometer system of claim 1, wherein the at least one torsionally operated MEMS electric field sensor includes a first torsionally operated MEMS electric field sensor and a second torsionally operated MEMS electric field sensor, the gradiometer system further comprising at least one electric field gradiometer including:
   the first torsionally operated MEMS electric field sensor, wherein the first torsionally operated MEMS electric field sensor includes the first electric field capacitive read-out configured to provide the first measurement of the received electric field;
   the second torsionally operated MEMS electric field sensor, wherein the second torsionally operated MEMS electric field sensor is coupled to the first torsionally operated MEMS electric field sensor and includes a second electric field capacitive read-out configured to provide a second measurement of the received electric field; and
   electric field sensor control electronics coupled to the first and second torsionally operated MEMS electric field sensors and configured to determine an electric field gradient of the second received electric field based on the first and second measurements from the first and second torsionally operated MEMS electric field sensors.

16. The gradiometer system of claim 15 further comprising a plurality of electric field generators that produce at least one reference field configured to mutually align the first and second torsionally operated MEMS electric field sensors to a common vector such that their electric dipole moments are aligned.

\* \* \* \* \*